United States Patent
Baek et al.

(10) Patent No.: US 8,330,207 B2
(45) Date of Patent: Dec. 11, 2012

(54) FLASH MEMORY DEVICE INCLUDING MULTILAYER TUNNEL INSULATOR AND METHOD OF FABRICATING THE SAME

(75) Inventors: Sung-kweon Baek, Suwon-si (KR); Sang-ryol Yang, Hwaseong-si (KR); Si-young Choi, Seongnam-si (KR); Bon-young Koo, Suwon-si (KR); Ki-hyun Hwang, Seongnam-si (KR); Jin-tae Noh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 647 days.

(21) Appl. No.: 12/003,992

(22) Filed: Jan. 4, 2008

(65) Prior Publication Data
US 2008/0128788 A1    Jun. 5, 2008

Related U.S. Application Data

(63) Continuation-in-part of application No. 11/589,789, filed on Oct. 31, 2006, now abandoned.

(30) Foreign Application Priority Data

Sep. 26, 2006  (KR) .................. 10-2006-0093524
Jan. 8, 2007   (KR) .................. 10-2007-0002152
Jul. 5, 2007   (KR) .................. 10-2007-0067610

(51) Int. Cl.
*H01L 29/788*   (2006.01)
*H01L 21/04*    (2006.01)

(52) U.S. Cl. ........ 257/321; 257/316; 257/324; 257/325; 257/E29.129; 257/E29.304; 257/E21.422; 438/261; 438/264

(58) Field of Classification Search .......... 257/314–326, 257/E29.129, E29.304, E21.422; 438/257–267
See application file for complete search history.

(56) References Cited

U.S. PATENT DOCUMENTS

| | | | |
|---|---|---|---|
| 5,138,410 A * | 8/1992 | Takebuchi | 257/314 |
| 5,604,357 A | 2/1997 | Hori | |
| 5,943,570 A | 8/1999 | Park et al. | |
| 6,140,676 A * | 10/2000 | Lancaster | 257/315 |
| 6,255,150 B1 * | 7/2001 | Wilk et al. | 438/191 |
| 6,455,890 B1 * | 9/2002 | Chang et al. | 257/321 |

(Continued)

FOREIGN PATENT DOCUMENTS

JP       04-320378       11/1992

(Continued)

OTHER PUBLICATIONS

Gnani et al. Band-Structure Calculations of SiO2 by Means of Hartree-Fock and Density-Functional Techniques, IEEE Transactions on Electron Devices, vol. 47, No. 10, Oct. 2000.*

(Continued)

*Primary Examiner* — Steven J Fulk
*Assistant Examiner* — Eric Ward
(74) *Attorney, Agent, or Firm* — Lee & Morse, P.C.

(57) ABSTRACT

A flash memory device including a lower tunnel insulation layer on a substrate, an upper tunnel insulation layer on the lower tunnel insulation layer, and a P-type gate on the upper tunnel insulation layer, wherein the upper tunnel insulation layer includes an amorphous oxide layer.

9 Claims, 15 Drawing Sheets

U.S. PATENT DOCUMENTS

| | | | |
|---|---|---|---|
| 6,586,797 B2 * | 7/2003 | Forbes et al. | 257/325 |
| 6,696,331 B1 * | 2/2004 | Yang et al. | 438/211 |
| 6,740,928 B2 * | 5/2004 | Yoshii et al. | 257/315 |
| 6,927,446 B2 | 8/2005 | Yoshino | |
| 7,279,740 B2 * | 10/2007 | Bhattacharyya et al. | 257/324 |
| 2002/0140023 A1 * | 10/2002 | Ohba et al. | 257/315 |
| 2004/0152260 A1 * | 8/2004 | Rabkin et al. | 438/257 |
| 2005/0093054 A1 * | 5/2005 | Jung | 257/310 |
| 2005/0142750 A1 * | 6/2005 | Jung | 438/257 |
| 2006/0077743 A1 * | 4/2006 | Jeon et al. | 365/222 |
| 2006/0166440 A1 | 7/2006 | Kaneoka et al. | |
| 2007/0018231 A1 | 1/2007 | Mitani et al. | |
| 2007/0042547 A1 * | 2/2007 | Kikuchi et al. | 438/257 |
| 2007/0132004 A1 * | 6/2007 | Yasuda et al. | 257/315 |
| 2007/0297244 A1 * | 12/2007 | Wu | 365/185.28 |

FOREIGN PATENT DOCUMENTS

| | | |
|---|---|---|
| JP | 11-214539 | 8/1999 |
| JP | 11-251460 | 9/1999 |
| JP | 2004-297092 | 10/2004 |
| JP | 2006-229195 | 8/2006 |
| KR | 1997-0054165 A | 7/1997 |
| KR | 10-2005-0116975 A | 12/2005 |
| KR | 10-2006-0031358 A | 4/2006 |
| KR | 10-2006-0077204 A | 7/2006 |

OTHER PUBLICATIONS

Gnani, Elena, et al, "Band-Structure Calculations of $SiO_2$ by Means of Hartree-Fock and Density-Functional Techniques," IEEE Transaction s on Electron Devices, vol. 47, No. 10, pp. 17951803 (Oct. 2000).

Wolf, S., "8.1 The Properties of Silica Glasses".

Silicon Processing for the VLSI Era, vol. 1, Lattice Press, p. 267 (2000).

* cited by examiner

① treated with ozone water
② not treated with ozone water
③ conventional tunnel insulator E : not removed
F : 30Å removed
G : 15Å removed
H : conventional tunnel insulator

FLASH MEMORY DEVICE INCLUDING MULTILAYER TUNNEL INSULATOR AND METHOD OF FABRICATING THE SAME

CROSS-REFERENCE TO RELATED APPLICATION

This application is a continuation-in-part application of U.S. patent application Ser. No. 11/589,789, filed on Oct. 31, 2006 now abandoned, which claims priority based on Korean Patent Application No. 10-2006-0093524, filed on Sep. 26, 2006, both of which are incorporated by reference herein in their entirety.

BACKGROUND OF THE INVENTION

1. Field of the Invention

Embodiments of the present invention relate to flash memory devices. More particularly, embodiments of the present invention relate to flash memory devices including a multilayer tunnel insulator, and methods of fabricating the same.

2. Description of the Related Art

One important criteria for evaluating properties of flash memory devices is characteristic(s) of a tunnel insulator included therein. Tunnel insulators are insulation layers through which a considerable number of electrons tunnel when programming information to or erasing information from floating gates. Various characteristics of tunnel insulators should be evaluated. For example, the insulating properties, dielectric constant, thickness, flexibility, thermal stability, film composition and density, and, more importantly, compatibility of the tunnel insulator with relatively cheap and/or commonly adopted processes for fabricating typical semiconductor devices should be evaluated. Silicon oxide layers have been widely used as tunnel insulators because silicon oxide layers generally meet the aforementioned requirements associated with tunnel insulators, are widely used in semiconductor processes, and are relatively cheap.

However, as the integration density of flash memory devices has been increasing, the film compositions and structures of flash memory devices have been gradually changing. For example, conductive materials are increasingly being replaced by metallic materials, and structures of films that were previously formed of conductive materials are gradually changing. Various layers other than a silicon oxide layer and a silicon nitride layer are increasingly being used as insulation layers.

Theoretically, as the integration density of flash memory devices increases, the thickness of tunnel insulators should be gradually reduced accordingly. That is, as the integration density of flash memory devices increases, sizes of elements of flash memory devices should be reduced accordingly in order for flash memory devices to operate properly even with low power, and to guarantee stable programming, erasing, and information retention capabilities even at low voltages and low currents.

However, it is not easy to form thinly structured tunnel insulators. From a manufacturing viewpoint, it is relatively difficult to form thin tunnel insulators. From an electrical viewpoint, when tunnel insulators are too thin, electrons stored in floating gates can easily pass through the tunnel insulators and, thus, are likely to leak from the tunnel insulators, thereby compromising image retention capabilities. Thus, a tunnel insulator should be formed to have an appropriate electrical thickness.

It is difficult, however, for conventional tunnel insulators, formed of silicon oxide to meet the requirements of facilitating the tunneling of electrons and enabling information program/erase-operation states even at low voltages, while having stable information retention capabilities.

The properties of tunnel insulators can be improved by using methods that involve forming a thin insulation layer having a high dielectric metal oxide such as hafnium oxide, aluminum oxide, titanium oxide, tantalum oxide, or lanthanide compounds. However, these metal oxides are neither materials that are widely used in the fabrication of semiconductor devices nor materials that are common and plentiful. In addition, it is relatively unstable and costly to form tunnel insulators using these metal oxides. Moreover, tunnel insulators that include these metal oxides generally provide poor interfacial properties with silicon substrates or other conductive materials. Furthermore, tunnel insulators that include these metal oxides are vulnerable to heat, and thus, are generally difficult to apply to the fabrication of semiconductor devices.

SUMMARY OF THE INVENTION

Embodiments of the present invention are therefore directed to a multilayer tunnel insulator employable in a flash memory device, and methods of fabricating such a multilayer tunnel insulator, which substantially overcome one or more of the problems due to the limitations and disadvantages of the related art.

It is therefore a feature of embodiments of the present invention to provide a flash memory device including a multilayer tunnel insulator that may be programmed or erased at a low voltage, while having improved information retention capabilities relative to devices employing a conventional single layer tunnel insulator.

It is therefore a separate feature of embodiments of the present invention to provide a method of forming a flash memory device including a multilayer tunnel insulator that may be programmed or erased at a low voltage, while having improved information retention capabilities relative to devices employing a conventional single layer tunnel insulator.

At least one of the above and other features and advantages of the present invention may be realized by providing a flash memory device, including a lower tunnel insulation layer on a substrate, an upper tunnel insulation layer on the lower tunnel insulation layer, and a P-type gate on the upper tunnel insulation layer, wherein the upper tunnel insulation layer includes an amorphous oxide layer.

The upper tunnel insulation layer may include a silicon-rich oxide layer.

The flash memory device may include an amorphous silicon layer between the lower tunnel insulation layer and the upper tunnel insulation layer.

The flash memory device may include a silicon-rich oxide between the lower tunnel insulation layer and the upper tunnel insulation layer.

The P-type gate may be a floating gate, and the flash memory device may include an intergate insulation layer on the floating gate and a control gate on the intergate insulation layer.

The flash memory device may include a charge trap insulation layer and a blocking layer between the upper tunnel insulation layer and the P-type gate, and a capping layer on the P-type gate electrode.

At least one of the above and other features and advantages of the present invention may be separately realized by providing a method of fabricating a flash memory device, including forming a lower tunnel insulation layer on a substrate, treating a surface of the lower tunnel insulation layer with ozone water, forming an upper tunnel insulation layer on the lower tunnel insulation layer, and forming a gate on the upper tunnel insulation layer.

Forming the lower tunnel insulation layer may include thermally oxidizing a surface of the substrate.

Forming the upper tunnel insulation layer may include forming an amorphous oxide layer.

Forming the upper tunnel insulation layer may include forming a silicon-rich oxide layer.

Forming the flash memory device may include forming an amorphous silicon layer between the lower tunnel insulation layer and the upper tunnel insulation layer.

Forming the flash memory device may include forming a silicon-rich oxide layer between the lower tunnel insulation layer and the upper tunnel insulation layer.

Forming the gate may include forming a P-type gate.

The method of fabricating a flash memory device may further include partially removing a surface of the upper tunnel insulation layer using a diluted HF solution or SC-1 after forming the upper tunnel insulation layer.

The P-type gate may be a floating gate and the flash memory device may further include forming an intergate insulation layer on the floating gate, and forming a control gate on the intergate insulation layer.

The method of fabricating a flash memory device may include a charge trap insulation layer and a blocking layer between the upper tunnel insulation layer and the P-type gate and a capping layer on the P-type gate.

At least one of the above and other features and advantages of the present invention may be separately realized by providing a flash memory device, including a multi-layer tunnel insulator on a substrate and a gate on the multi-layer tunnel insulator, wherein the multi-layer tunnel insulator may include a first tunnel insulation layer having a first energy gap, and a second tunnel insulation layer having a second energy gap greater than the first energy gap.

The multi-layer tunnel insulator may include a third tunnel insulation layer between the first tunnel insulation layer and the second tunnel insulation layer, wherein the third tunnel insulation layer may have a third energy gap smaller than the first energy gap.

The gate may be a floating gate, and the flash memory device may include an intergate insulation layer on the floating gate, and a control gate on the intergate insulation layer.

The gate may be a P-type gate and the flash memory device may include a charge trap insulation layer and a blocking layer between the upper tunnel insulation layer and the P-type gate, and a capping layer on the P-type gate.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
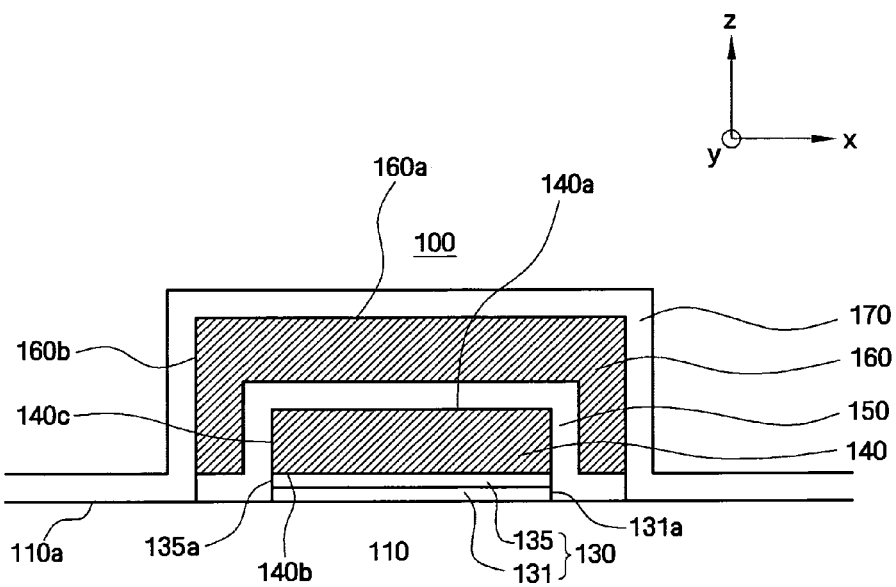
FIGS. 1A and 1B illustrate cross-sectional views of a first exemplary embodiment of a unit cell of a flash memory device.

Korean Patent Application No. 10-2007-0002152, filed on Jan. 8, 2007, and No. 10-2007-0067610, filed on Jul. 5, 2007, in the Korean Intellectual Property Office, and entitled: "Flash Memory Device Including Multilayer Tunnel Insulator and Method of Fabricating the Same," are incorporated by reference herein in their entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these exemplary embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer, element or substrate, it can be directly on the other layer, element or substrate, or intervening layers and/or elements may also be present. Further, it will be understood that when a layer or element is referred to as being "under" another layer or element, it can be directly under, and one or more intervening layers and/or elements may also be present. In addition, it will also be understood that when a layer or element is referred to as being "between" two layers or elements, it can be the only layer or element between the two layers or elements, or one or more intervening layers and/or elements may also be present. Like reference numerals refer to like elements throughout the specification.

In this disclosure, a tunnel insulation layer will be regarded as an insulation layer for convenience, even when the tunnel insulation layer is not formed of an insulation material but includes, e.g., an undoped silicon layer.

Further, embodiments of the present invention relate to flash memory devices including an insulation layer, e.g., a multilayer tunnel insulator having various energy band gaps. A technique that may be implemented in embodiments of the present invention is called "energy-band-gap engineering" or "energy-barrier engineering." The technique may include a high energy barrier level of the multilayer tunnel insulator in an information-read-operation state of the flash memory device, and a low energy barrier level of the multilayer tunnel insulator in information-program/erase-operation states. Accordingly, information-retention characteristics in the information-read-operation state, and charge-tunneling characteristics in the information-program/erase-operation states of the flash memory devices may be improved. The technique relates to an insulator layer, e.g., the multilayer tunnel insulator, being physically thick and/or electrically thin.

Exemplary flash memory devices employing one or more aspects of the invention and exemplary methods of fabricating flash memory devices according to one or more aspects of the invention will hereinafter be described in detail with the accompanying drawings in which exemplary embodiments of the invention are shown.

Figure 1B:
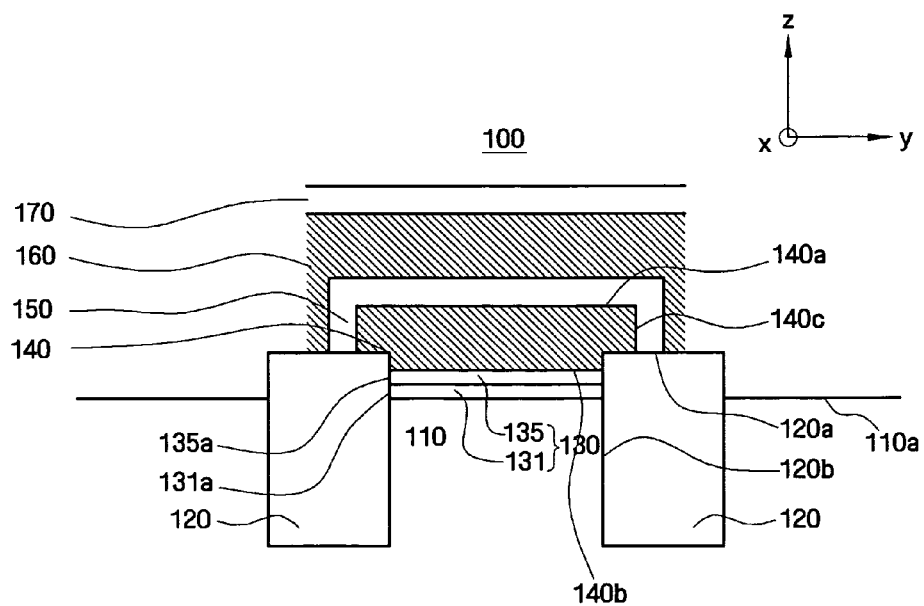

FIGS. 1A and 1B illustrate cross-sectional views of a first exemplary embodiment of a unit cell 100 employable by a flash memory device. Specifically, the cross-sectional view illustrated in FIG. 1A is taken along a XZ plane that extends along the X direction and the Z direction, and is perpendicular to a XY plane extending along the X direction and the Y direction, along which a substrate 110 of the unit cell 100 extends, and the cross-sectional view illustrated in FIG. 1B is taken along a YZ plane that extends along the Y and Z directions. The X direction may be perpendicular to the Y direction, and both the X direction and the Y direction may be perpendicular to the Z direction.

Referring to FIG. 1A, the unit cell 100 may include a tunnel insulator 130, including a lower tunnel insulation layer 131 and an upper tunnel insulation layer 135, a floating gate 140, an intergate insulation layer 150, a control gate 160, and a capping layer 170.

The lower insulation layer 131 may be formed on a substrate 110, the upper tunnel insulation layer 135 may be formed on the lower tunnel insulator layer 131, the floating gate 140 may be formed on the upper tunnel insulation layer 135, the intergate insulation layer 150 may be formed on the floating gate 150, the control gate 160 may be formed on the floating gate 150, and the capping layer 170 may cover an upper surface 160a and side surfaces 160b of the control gate 160, and may contact the substrate 110.

Referring to FIG. 1B, the lower and upper tunnel insulation layers 131 and 135 may extend between a pair of isolations 120. At least portions of upper surfaces 120a and/or side surfaces 120b of the isolations 120 may contact portions, e.g., end portions, of the floating gate 140, portions of the intergate insulation layer 150, and/or portions of the control gate 160. In embodiments of the present invention, the isolations 120 may be shallow trench isolations that protrude beyond an upper surface 110a of the substrate 110.

The substrate 110 may be any substrate used in typical semiconductor processes. For example, the substrate 110 may be a silicon substrate. At least the upper surface 110a of the substrate 110 may include monocrystalline silicon.

The lower tunnel insulation layer 131 may be a single crystalline silicon oxide layer. The lower tunnel insulation layer 131 may be formed by thermally oxidizing the upper surface 110a of the substrate 110. For example, if the upper surface 110a of the substrate 110 is formed of crystalline silicon, the lower tunnel insulation layer 131 may be a silicon oxide layer that is formed by oxidizing crystalline silicon. The lower tunnel insulation layer 131 may extend between and contact portions of the intergate insulation layer 150 along the X direction, and may extend between and contact the isolations 120 along the Y direction.

In embodiments of the present invention, the upper tunnel insulation layer 135 may be or include, e.g., a silicon oxide layer. More particularly, in some embodiments of the invention, the upper tunnel insulation layer 135 may be or include an amorphous silicon oxide layer or a silicon-rich-oxide layer. The upper tunnel insulation layer 135 may extend between and contact the intergate insulation layer 150 along the X direction, and may extend between and contact the isolations 120 along the Y direction.

In embodiments of the present invention, the upper tunnel insulation layer 135 may have a larger energy band gap than the lower tunnel insulation layer 131, e.g., a polycrystalline silicon oxide layer. For example, in embodiments in which the upper tunnel insulation layer 135 is an amorphous silicon oxide layer and the lower tunnel insulation layer 131 is a monocrystalline silicon oxide layer, the upper tunnel insulation layer 135 may have a larger energy band gap than the lower tunnel insulation layer 131. More particularly, in some embodiments in which the upper tunnel insulation layer 135 is an amorphous silicon oxide layer, the upper tunnel insulation layer 135 may have an energy band gap that is about 0.15 eV larger than an energy band gap of a monocrystalline silicon oxide layer or an energy band gap of a polycrystalline silicon oxide layer, which may be employed by the lower insulation layer 131. In embodiments of the present invention, by providing an upper tunnel insulation layer 135 having a larger energy band gap than a monocrystalline or polycrystalline silicon oxide layer, which may be employed by the lower insulation layer 131, it is possible to improve the information retention capabilities of electrically erasable programmable read only memories (EEPROMs) or flash memories, and enhance the tunneling properties of electrons.

In the exemplary embodiment illustrated in FIG. 1B, a combined thickness of the lower and upper tunnel insulation layers 131 and 135 along the Z direction may be smaller than a distance, along the Z direction, that the isolations 120 protrude beyond the upper surface 110a of the substrate 110. However, in some embodiments of the present invention, the tunnel insulator 130 including the lower and upper tunnel insulation layers 131 and 135 may be formed to extend further from the upper surface 110a of the substrate 110 along the X direction than the isolations 120, i.e., as high as or even higher than the isolations 120 relative to the upper surface 110a of the substrate 100.

The floating gate 140 may include a conductive material capable of storing information. For example, the floating gate 140 may include polycrystalline silicon having conductivity. At least portions of the upper surfaces 120a and/or the lateral surfaces 120b of the isolations 120 may contact portions, e.g., end portions, of the floating gate 140. Referring to FIG. 1B, an upper portion of the floating gate 140 may at least partially overlap the isolations 120 along the Y direction such that the floating gate 140 may have stepped shaped sides extending along the Z direction. In such embodiments, e.g., exemplary embodiment illustrated in FIGS. 1A and 1B, an area of an upper surface 140a of the floating gate 140 may be larger than an area of a lower surface 140b of the floating gate 140.

Conventionally, floating gates are generally formed as an N-type gate. In embodiments of the invention, the floating gate 140 may include a P-type gate. A P-type gate may have a work function greater than that of an N-type gate. Accordingly, information-retention characteristics of flash memory devices including a P-type gate may be improved because a Fermi level of the P-type gate may be lower than a Fermi level of a N-type gate.

Further, an erase voltage level of a P-type gate is generally about 1 to 2 volts higher than an erase voltage level of an N-type gate. Accordingly, in general, flash memory devices using a single tunnel insulator do not include a P-type gate. More particularly, increasing the erase voltage generally influences an endurance of the tunnel insulator 130, and thus, an erasing time for erasing information may be extended.

However, in some embodiments of the present invention, the tunnel insulator 130, e.g., the multilayer tunnel insulator, may have an erase voltage lower than that of the conventional tunnel insulator. Accordingly, the multilayer tunnel insulator, e.g., the tunnel insulator 130, employable by embodiments of the present invention may have improved endurance and a shortened erase time. Additionally, in embodiments of the invention, a P-type gate may be employed as a gate electrode, e.g., the floating gate 140, of the flash memory devices.

Accordingly, in flash memory devices according to one or more aspects of the invention, a multilayer tunnel insulator, according to one or more aspects of the present invention, may enable a P-type gate, having improved information-retention characteristics, to be employed without resulting in a higher erase voltage, i.e., a same or lower erase voltage as that used in conventional flash memory devices.

The intergate insulation layer 150 may electrically insulate the floating gate 140 from another conductive material, e.g., the control gate 160. In embodiments of the present invention, the intergate insulation layer 150 may include, e.g., three layers, such as a silicon oxide layer, a silicon nitride layer, and a silicon oxide layer, or a single material as a single layer. The intergate insulation layer 150 may cover the upper surface 140a and side surfaces 140c of the floating gate 140. For example, the intergate insulation layer 150 together with the substrate 110, the isolations 120 and/or the tunnel insulator 130 may surround the floating gate 140. Respective portions of the intergate insulation layer 150 may extend, e.g., along a side surface 131a of the lower insulation layer 131 and a side surface 135a of the upper tunnel insulation layer extending along the Z direction. The intergate insulation layer 150 may, e.g., contact and/or overlap at least a portion of the upper surface(s) 120a of the isolations 120.

As shown in FIG. 1A, a portion of the intergate insulation layer 150 may contact the substrate 110. Although FIG. 1A illustrates a portion of the intergate insulation layer 150 contacting the substrate 110 and extending further along the X direction away from the tunnel insulator 130, the intergate insulation layer 150 may not extend along the upper surface 110a the substrate 110. That is, a thickness along the X direction of the portion(s) of the intergate insulation layer 150 contacting the substrate 110 and a thickness along the X direction of the portion(s) of the intergate insulation layer 150 extending along the Z direction and overlapping the side(s) 140c of the floating gate 140 and/or the sides 131a, 135a of the lower and upper tunnel insulation layers 131,135 may be substantially the same.

The control gate 160 may include a conductive material. For example, the control gate 160 may include polycrystalline silicon having conductivity. The control gate 160 may be formed on the intergate insulation layer 150 and/or portions of the substrate 110. More particularly, e.g., the control gate 160 may be formed on portions of the intergate insulation layer 150 overlapping the upper surface 140a and/or the sides 140c of the floating gate 140 and/or contacting the substrate 110, and/or on portions of the intergate insulation layer 150 overlapping the sides 131a, 135a of the lower and upper tunnel insulation layers 131, 135. The control gate 160 may not directly contact the substrate 110, and thus, e.g., in some embodiments of the present invention, the control gate 160 may only extend on the upper surface 140a of the control gate 140.

The capping layer 170 may include silicon oxide. The capping layer 170 may cover the upper surface 160a and the side surfaces 160b of the control gate 160. The capping layer 170 may contact portions of the intergate insulation layer 150, e.g., portions of the intergate insulation layer 150 extending along the X direction away from the tunnel insulation layer 130 and/or portions of the substrate 110. The capping layer 170 may have a uniform and/or substantially uniform thickness along an entire length thereof, irrespective of directions along which particular portions thereof may extend, e.g., along the Z direction along the side surfaces 160b of the control gate 160, along the Y direction along the upper surface 160a of the control gate 160. In some embodiments, the capping layer 170 together with the substrate 110 and/or the isolations 120 may surround the control gate 160, the intergate insulation layer 150, the floating gate 140 and the tunnel insulation layer 130.

The tunnel insulator 130 employing one or more aspects of the present invention may be employed, e.g., in various types of memory devices. For example, the unit cell 100 shown in FIG. 1A may be, e.g., a charge trap flash (CTF) memory device. In such cases, the tunnel insulator 130 may serve as a lower insulation layer. In general, a CTF memory device may include a silicon-oxide-nitride-oxide-silicon (SONOS) structure, and the tunnel insulation 130 may serve as a lower oxide layer of such a CTF memory device. If the unit cell 110 shown in FIG. 1A corresponds to a flash memory device including a tantalum, aluminum-oxide, nitride, oxide and silicon (TANOS) structure, the tunnel insulator 130 may also serve as a lower oxide layer. In such cases, e.g., the tantalum may be in the form of, e.g., an oxide or nitride (TaO or TaN). Generally, the TANOS structure may include a silicon nitride layer (nitride), a silicon oxide layer (oxide), and a silicon substrate (silicon). The SONOS structure and the TANOS structure are well known to one of ordinary skill in the art to which one or more aspects of the present invention pertains, and thus, detailed descriptions thereof will be omitted.

Factors that may be used to determine properties of the tunnel insulator 130 may include a thickness, e.g., physical thickness such as height relative to the XY plane and/or electrical thickness, and energy band gap of the tunnel insulator 130. Operations for storing information in the floating gate 140, e.g., information program/erase-operation states, may generally be performed at a higher electric potential difference than an information-read-operation state, and an information-erase-operation state may be performed at a higher electric potential difference than an information-program-operation state. For example, in some embodiments, an information-read-operation state may be performed at a voltage of about 2 V to about 5 V, and information program/erase operation states may be performed at a voltage of about 12 V to about 18 V. One of the operating voltages of information program/erase operation states may be a negative voltage. A voltage that is needed for retaining information may be lower than the operating voltage of the information-read-operation state. Accordingly, the tunnel insulator 130 may be required to facilitate tunneling at relatively high voltages, and provide excellent information-retention capabilities at low voltages.

In embodiments of the present invention, the tunnel insulator 130 may have a larger energy band gap than a conventional single-layer tunnel insulator, and/or may be thicker than a conventional single-layer tunnel insulator. Therefore, embodiments of the present invention may provide flash memory devices having improved information retention capabilities at low voltages.

Figure 2A:
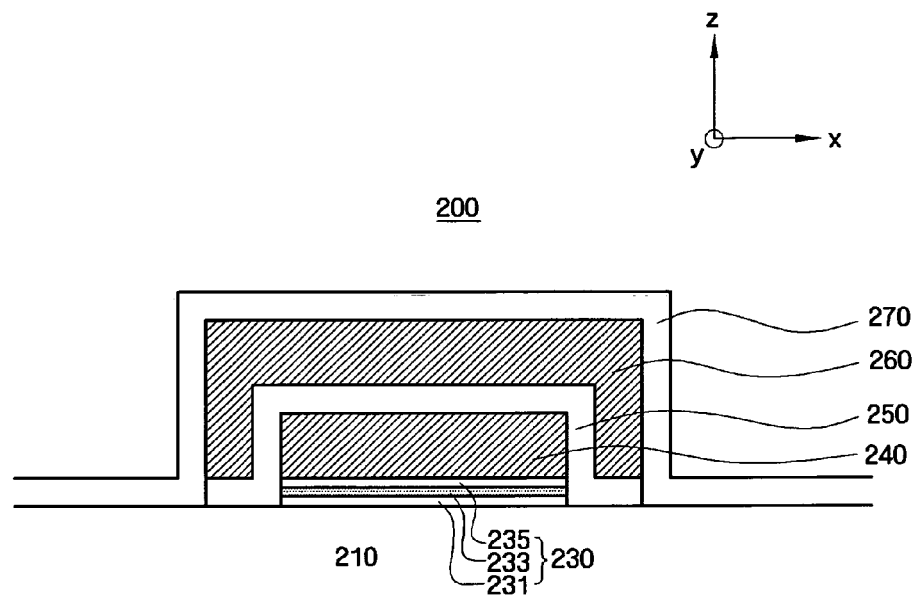
FIGS. 2A and 2B illustrate cross-sectional views of a second exemplary embodiment of a unit cell of a flash memory device.
Figure 2B:
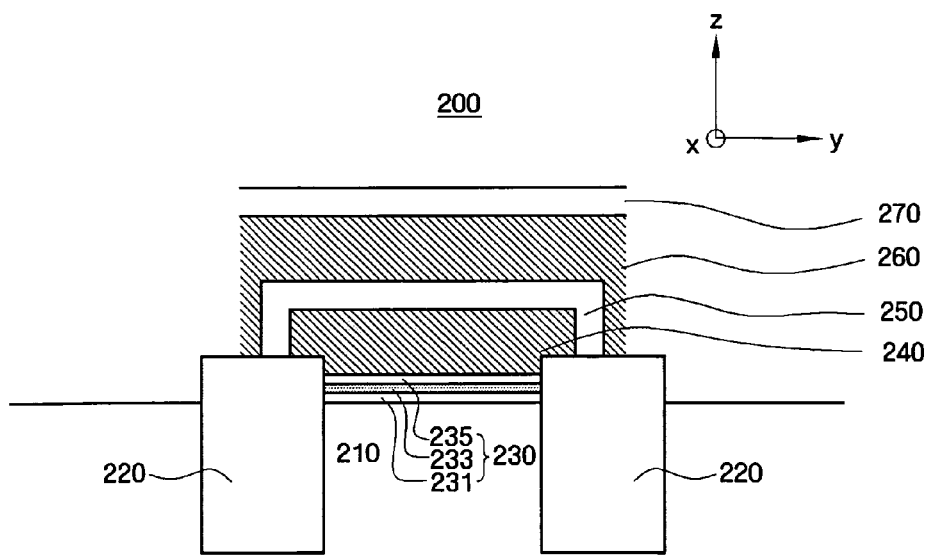

FIGS. 2A and 2B illustrate cross-sectional views of a second exemplary embodiment of a unit cell 200 employing one or more aspects of the present invention. In general, only differences between the exemplary embodiment illustrated in FIGS. 1A and 1B and the exemplary embodiment illustrated in FIGS. 2A and 2B will be described below. Referring to FIGS. 2A and 2B, the unit cell 200 may include a tunnel insulator 230. The tunnel insulator 230 may include three or more layers. For example, the tunnel insulator 230 may include a lower tunnel insulation layer 231, an upper tunnel insulation layer 235, and an intermediate tunnel insulation layer 233. The intermediate tunnel insulation layer 233 may be interposed between the lower tunnel insulation layer 231 and the upper tunnel insulation layer 235.

In some embodiments of the present invention, the intermediate tunnel insulation layer 233 may, e.g., be and/or include amorphous silicon or silicon-rich-oxide. More particularly, e.g., in some embodiments of the invention, the intermediate tunnel insulation layer 233 may, e.g., be and/or include amorphous silicon with no impurities implanted therein.

Figure 3A:
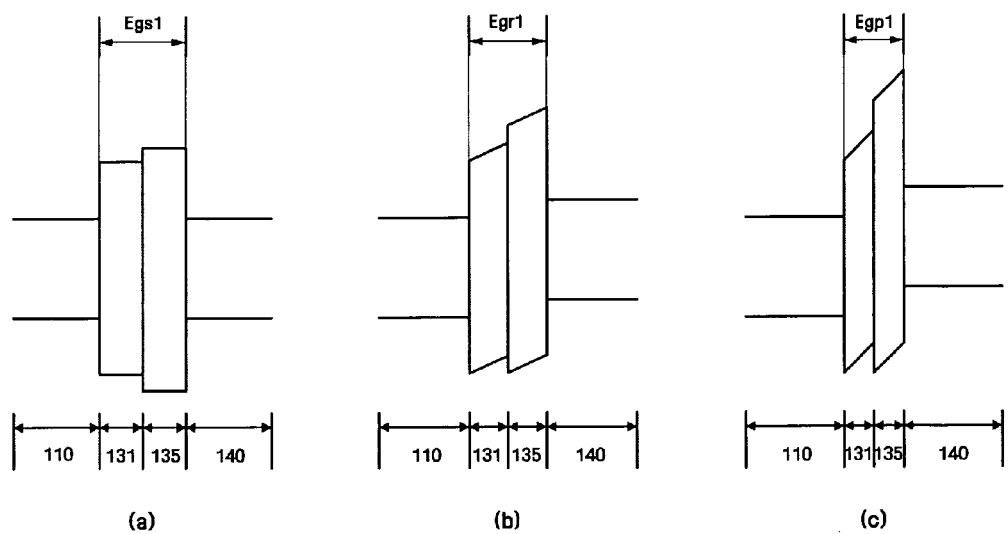
FIGS. 3A to 3C illustrate energy band diagrams for explaining features of exemplary embodiments of the present invention.
Figure 3B:
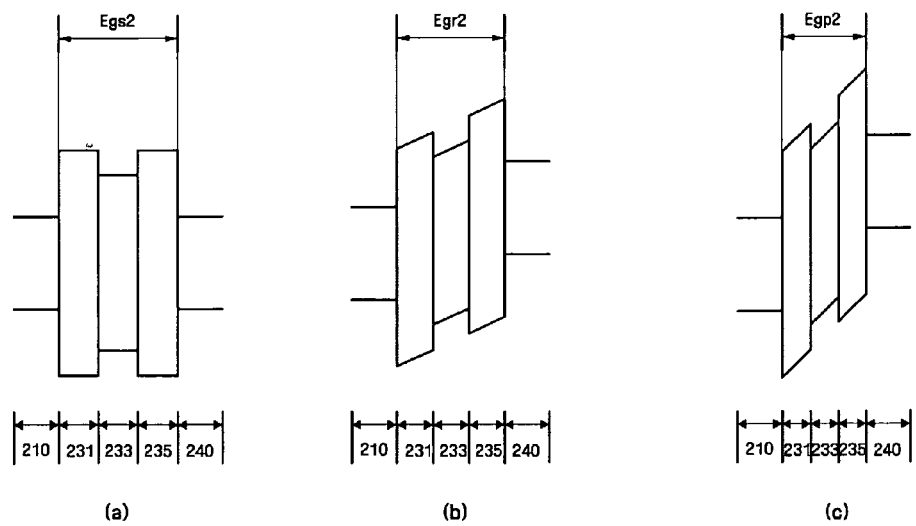
Figure 3C:
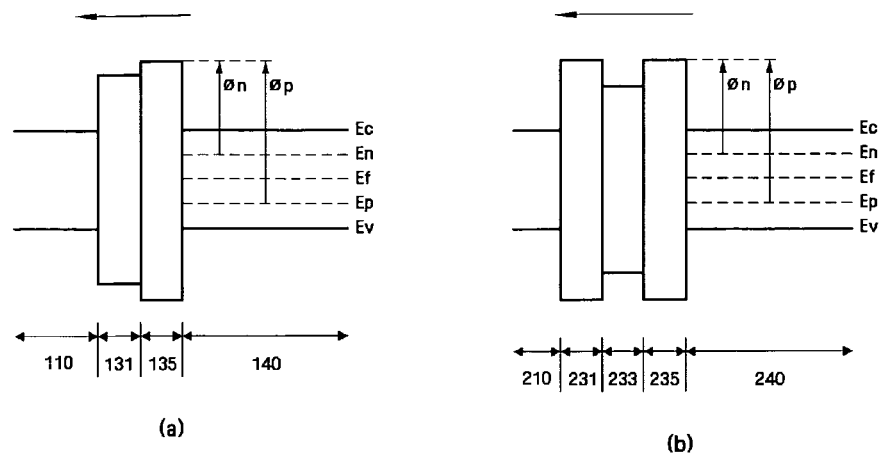

FIGS. 3A to 3C illustrate energy band diagrams for explaining features of exemplary embodiments of the present invention.

Referring to FIGS. 3A and 3B, in some embodiments of the invention, Egs1>Egr1>Egp1, and Egs2>Egr2>Egp2.

Referring to the energy band model illustrated in portion (a) of FIG. 3A, i.e., an energy band model of the flash memory device 100 illustrated in FIGS. 1A and 1B, the energy bands of the substrate 110, the lower tunnel insulation layer 131, the upper tunnel insulation layer 135, and the floating gate 140 are in thermal equilibrium when no voltage is applied to the flash memory device 100. Still referring to the energy band model illustrated in portion (a) of FIG. 3A, in the exemplary embodiment illustrated, the substrate 110 and the floating gate 140 have similar energy band gaps, the lower tunnel insulation layer 131 has a larger energy band gap than the substrate 110 and the floating gate 140, and the upper tunnel insulation layer 135 has a larger energy band gap that the lower tunnel insulation layer 131. The energy band gap Egs1 across which electrical charges or electrons must be tunneled may correspond to a sum of the thicknesses of the lower tunnel insulation layer 131 and the upper tunnel insulation layer 135.

In embodiments of the invention, the tunnel insulator 130, i.e., the multilayer tunnel insulator, includes at least two tunnel insulation layers 131 and 135, which have different energy band gaps. More particularly, in such embodiments of the invention, the energy band gap of the upper tunnel insulation layer 135 may be greater than that of the lower tunnel insulation layer 131.

Portion (b) of FIG. 3A illustrates an energy band gap Egr1 during, e.g., an information-read-operation state performed by the flash memory device 100. During the information-read-operation state, a relatively low voltage may be applied to the flash memory device 100. In the exemplary embodiment illustrated, the energy band gap Egr1 bends slightly, and maintains a sufficient thickness to retain programmed data while providing energy needed for tunneling for the information-read-operation state. Therefore, the information-retention capabilities of the flash memory device 100 may be enhanced.

Portion (c) of FIG. 3A illustrates an exemplary energy band gap Egp1 during information-program/erase-operation states performed by the flash memory device 100. During an information-program/erase operation state, a higher voltage than the voltage applied during the information-read-operation state may be applied to the flash memory device 100. In the exemplary embodiment illustrated, the energy band gap Egp1 bends considerably and enables tunneling for the information-program/erase-operation states.

More particularly, flash memory devices according to one or more aspects of the present invention may have a relatively higher energy barrier in the information-read-operation state, and a lower energy barrier in the information-program/erase-operation states.

Referring to the energy band model illustrated in portion (a) of FIG. 3B, i.e., an energy band model of the flash memory device 200 illustrated in FIGS. 2A and 2B, the energy bands of the substrate 210, the lower tunnel insulation layer 231, the upper tunnel insulation layer 235, and the floating gate 240 are in thermal equilibrium when no voltage is applied to the flash memory device 200. Referring further to the energy band model illustrated in portion (a) of FIG. 3B, the substrate 210 and the floating gate 240 may have similar energy band gaps. The lower tunnel insulation layer 231 may have a larger energy band gap than the substrate 210 and the floating gate 240. The upper tunnel insulation layer 235 has a similar energy band gap to the lower tunnel insulation layer 231. In some embodiments, the upper tunnel insulation layer 235 may have a larger energy band gap than the lower tunnel insulation layer 231. The intermediate tunnel insulation layer 233 may have a smaller energy band gap than lower and/or upper tunnel insulation layers 231, 235. However, the energy band gap of the intermediate tunnel insulation layer 233 may not necessarily be smaller than the energy band gap of the lower tunnel insulation layer 231. That is, the energy band gap of the intermediate tunnel insulation layer 233 may be the same as and/or larger than the energy band gap of the lower tunnel insulation layer 231 and/or the upper tunnel insulation layer 235. The energy band gap Egs2 across which the electrical charges or electrons are to tunnel may correspond to a sum of the thicknesses of the lower tunnel insulation layer 231, the intermediate tunnel insulation layer 233, and the upper tunnel insulation layer 235.

The multilayer tunnel insulator 230 in exemplary embodiments of the present invention may include at least three tunnel insulation layers 231, 233, and 235 that have different energy band gaps. More particularly, the energy band gap of the intermediate tunnel insulation layer 233 may be smaller than that of the lower tunnel insulation layer 231. In some embodiments, the energy band gap of the lower and upper tunnel insulation layers 233 and 235 may be the same and/or substantially same, while the energy band gap of the intermediate tunnel insulation layer 233 is different.

Portion (b) of FIG. 3B illustrates an energy band gap Egr2 during, e.g., an information-read-operation state performed by the flash memory device 200. During the information-read-operation state, a relatively low voltage may be applied to the flash memory device 100. Accordingly, the energy band gap Egr2 bends slightly, and maintains a sufficient thickness to retain programmed data while providing energy needed for tunneling for the information-read-operation state. Therefore, the information-retention capabilities of the exemplary flash memory device 200 may be enhanced.

Portion (c) of FIG. 3B illustrates an energy band gap Egp2 during an information-program/erase-operation state performed by the flash memory device 200. During the information-program/erase-operation state, a higher voltage than the voltage applied during an information-read-operation state is applied to the flash memory device 200. Accordingly, the energy band gap Egp2 bends considerably and enables tunneling for the information-program/erase-operation states.

Accordingly, in some embodiments of the present invention, characteristics of a relatively higher energy barrier in the information-read-operation state, and a lower energy barrier in the information-program/erase-operation states may be improved.

While specific relationships are illustrated in the exemplary energy band gap diagrams of FIGS. 3A and 3B, embodiments of the invention are not limited thereto.

Embodiments of the invention may enable the information retention capabilities of the flash memory devices 100 and 200 during an information-read-operation state to be considerably enhanced. Embodiments of one or more aspects of the invention, such as the flash memory devices 100 and 200, may separately provide improved tunneling properties than a conventional single-layer tunnel insulator at voltages for information-program/erase-operation states. More particularly, embodiments of one or more aspects of the invention, such as the flash memory devices 100 and 200, may separately provide more improved tunneling properties during an information-erase-operation state.

More particularly, e.g., in some embodiments of the invention in which the intermediate tunnel insulation layer 233 is a silicon layer, and, more particularly, an amorphous silicon layer, the flash memory device 200 may operate more smoothly.

If, e.g., the intermediate tunnel insulation layer 233 or the upper tunnel insulation layer 235 is a silicon-rich-oxide layer, such a layer may have an energy band gap that is larger than an energy band gap resulting from a silicon layer, but smaller than an energy band gap resulting from an insulation layer. Therefore, embodiments of the invention may provide a multilayer tunnel insulator which is electrically thinner, but physically thicker, than a conventional single-layer tunnel insulator. That is, embodiments of the invention may provide improved tunneling characteristics and/or information retention capabilities, and thus, e.g., improved flash memory devices.

In some embodiments of the invention, a silicon-rich-oxide layer may be formed during the formation of the intermediate insulation layer 233 or the upper tunnel insulation layer 235. For example, a silicon layer may be formed, and an oxidization operation may be performed on a top surface of the silicon layer, but not to the extent that the entire silicon layer is oxidized. As a result, portions close to the top surface of the silicon layer may include completely oxidized silicon, and portions close to a bottom surface of the silicon layer include non-oxidized, pure silicon. As a result, the silicon layer may be an incompletely oxidized silicon oxide layer, i.e., a silicon-rich-oxide layer.

If, e.g., the intermediate tunnel insulation layer 233 is formed of silicon-rich-oxide, it may be relatively physically thick. As a result, the process of forming the tunnel insulator 230 may be facilitated. Because the tunnel insulator 230 may be physically thicker than a conventional single-layer tunnel insulator and may include the upper tunnel insulator 235 having a relatively large energy band gap, the information retention capabilities of a flash memory device at voltages for electrically retaining information may be enhanced.

Referring to FIG. 3C, portions (a) and (b) of FIG. 3C illustrate energy band diagrams of an N-type gate and a P-type gate that have different Fermi levels.

Particularly, the Fermi level of the N-type gate may be between the Fermi level of an intrinsic semiconductor, e.g. center level of an energy band gap, and a conduction band. The Fermi level of the P-type gate may be between the Fermi level of an intrinsic semiconductor, e.g. center level of the energy band gap, and a valence band. Accordingly, electrons of the P-type gate should have a higher energy, i.e., work function: $\Phi n<\Phi p$, than electrons of the N-type gate in order to go over the energy barrier, i.e., direction of arrows. Hence, the P-type gate may have better information-retention characteristics than the N-type gate.

Figure 4A:
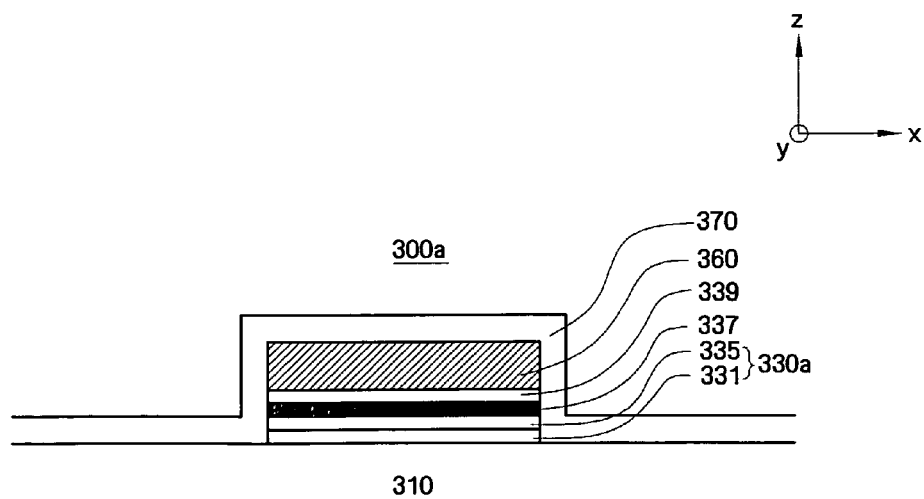
FIGS. 4A and 4B illustrate cross-sectional views, along an XZ plane, of an exemplary SONOS or TANOS type CTF memory device employing one or more aspects of the present invention.

FIG. 4A illustrates a cross-sectional view, along an XZ plane, of an exemplary SONOS- or TANOS-type CTF memory device 300a employing one or more aspects of the present invention. Referring to FIG. 4A, the CTF memory device 300a may include a multilayer tunnel insulator 330a, a charge trap layer 337, a blocking layer 339, a gate electrode 360, and an insulation capping layer 370.

The multilayer tunnel insulator 330a may be on a substrate 310, the charge trap layer 337 may be on the multilayer tunnel insulator 330a, the blocking layer 339 may be on the charge trap layer 337, the gate electrode 360 may be on the blocking layer 339, and the dielectric capping layer 370 may be on the gate electrode 360. The multilayer tunnel insulator 330a may include a lower tunnel insulation layer 331 and an upper tunnel insulation layer 335. The upper tunnel insulation layer 335 may be formed on the lower tunnel insulation layer 331.

The charge trap layer 337 may include a silicon nitride layer, and the blocking layer 339 may include a silicon oxide layer. Charge trap layers and blocking layers are well known to persons of ordinary skill in the art to which one or more aspects of the present invention pertain, and thus, detailed descriptions of the charge trap layer 337 and the blocking layer 339 will not be provided.

The multilayer tunnel insulator 330a may correspond to the multilayer tunnel insulator 130 of FIGS. 1A and 1B. Thus, a detailed description of the multilayer tunnel insulator 330a will not be provided.

Figure 4B:
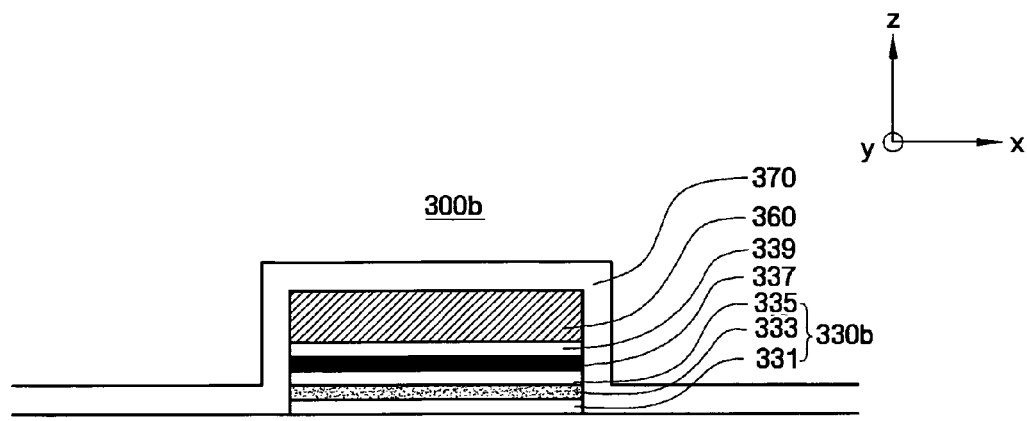

FIG. 4B illustrates a cross-sectional view, along an XZ plane, of an exemplary SONOS- or TANOS-type CTF memory device 300b employing one or more aspects of the present invention. Referring to FIG. 5, the CTF memory device 300b may include a multilayer tunnel insulator 330b, the charge trap layer 337, the blocking layer 339, the gate electrode 360, and the dielectric capping layer 370.

The multilayer tunnel insulator 330b may be on the substrate 310, the charge trap layer 337 may be on the multilayer tunnel insulator 330b, the blocking layer 339 may be on the charge trap layer 337, the gate electrode 360 may be on the blocking layer 339, and the dielectric capping layer 370 may be on the gate electrode 360. The multilayer tunnel insulator 330b may include a lower tunnel insulation layer 331, an intermediate tunnel insulation layer 333 on the lower tunnel insulation layer 331, and an upper tunnel insulation layer 335 on the intermediate tunnel insulation layer 333.

The multilayer tunnel insulator 330b may correspond to the multilayer tunnel insulator 230 of FIGS. 2A and 2B. Thus, a detailed description of the multilayer tunnel insulator 330b will not be provided.

In CTF memory devices 300a and 300b according to one or more aspects of the invention, the information-retention characteristics may be improved by employing the P-type gate as the gate electrode 360.

Additionally, if the gate electrode 360, e.g., entire gate electrode, is formed as a P-type gate, conductance of such gate electrodes in CTF memory devices 300a and 300b may be decreased. This problem can be overcome by having the gate electrode 360 include, e.g., a metal or a metal silicide layer. For example, the gate electrode 360 may include two or more parts, e.g., one part may be the P-type gate, which may be located adjacent to the charge trap layer 337, and another part may be the metal or metal silicide layer. In some embodiments, an N-type gate may be formed on the metal or the metal silicide layer.

Figure 5A:
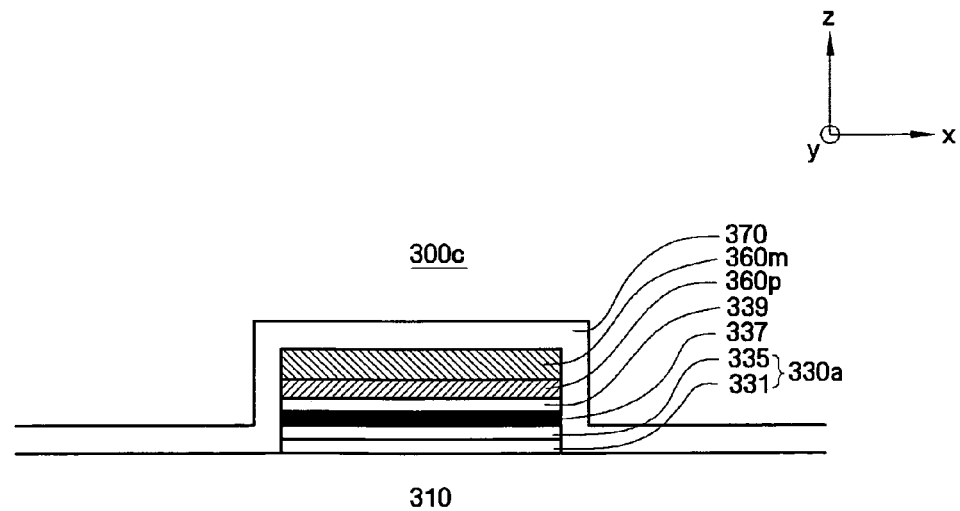
FIGS. 5A and 5B illustrate cross-sectional views of other exemplary CTF memory devices employing one or more aspects of the present invention.
Figure 5B:
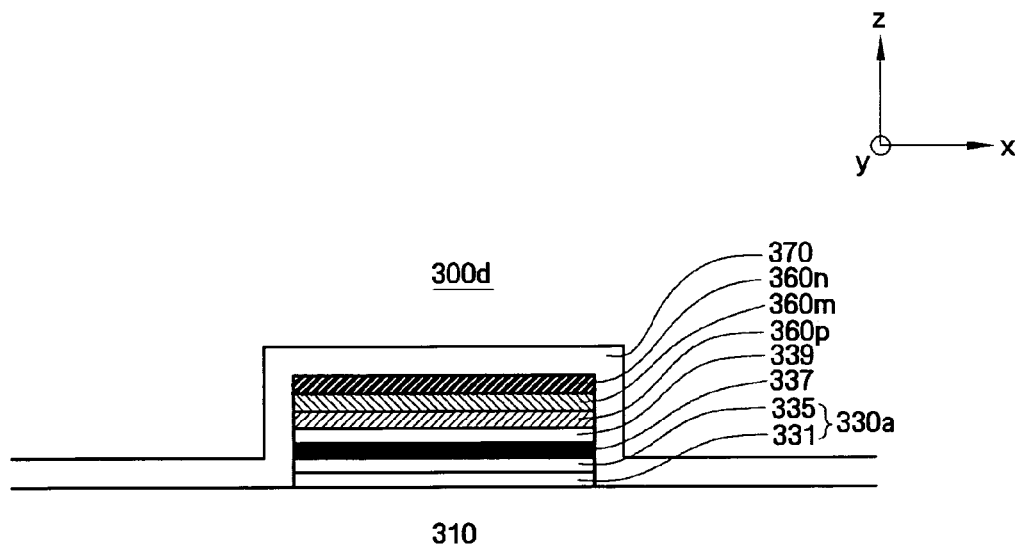

FIGS. 5A and 5B illustrate cross-sectional views of other exemplary gate electrodes of CTF memory devices 300c, 300d including P-type gates.

FIG. 5A illustrates a cross-sectional view along the XZ plane of an exemplary SONOS- or TANOS-type CTF memory device 300c including a P-type gate 360p and a metal silicide 360m.

In this exemplary embodiment, the P-type gate 360p may be formed adjacent to the charge trap layer 337. Accordingly, information-retention characteristics of the CTF memory 300c may be improved. Further, by providing, e.g., the metal silicide 360m, the conductance of the gate electrodes 360p and 360m may be improved.

FIG. 5B illustrates a cross-sectional view along the XZ plane of exemplary SONOS- or TANOS-type CTF memory device 300d including the P-type gate 360p, metal silicide 360m, and an N-type gate 360n.

In this exemplary embodiment, the N-type gate 360n may be formed on the metal silicide layer 360m. Accordingly, a cost of manufacturing the CTF memory devices 300d may be lower than a cost of manufacturing the CTF memory device 300c.

In embodiments of the invention, the tunnel insulators 130, 230, 330a, and 330b may be physically thicker than a conventional single-layer tunnel insulator, but may be electrically thinner than a conventional single-layer tunnel insulator. Because the tunnel insulators 130, 230, 330a, and 330b may be electrically thinner than a conventional single-layer tunnel insulator, the tunnel insulators 130, 230, 330a, and 330b may provide better tunneling properties than a conventional single-layer tunnel insulator. Memory devices employing one or more of the tunnel insulators 130, 230, 330a, and 330b, which may have a higher energy barrier than a conventional single-layer tunnel insulator, may have improved information retention capabilities than a conventional single-layer tunnel insulator.

A method of fabricating an exemplary flash memory device according to an exemplary embodiment of the present invention will hereinafter be described in detail. FIGS. 6, 7A, 7B, 8A, 8B, 9A, 9B, 10A and 10B illustrate cross-sectional views of resulting structures of stages in an exemplary method of fabricating a flash memory device employing the exemplary embodiment of the multilayer tunnel structure 130 illustrated in FIGS. 1A and 1B. More particularly, FIGS. 7A, 8A, 9A and 10A illustrate cross-sectional views of the exemplary flash memory device along an XZ plane, and FIGS. 7B, 8B, 9B and 10B illustrate cross-sectional views of the exemplary flash memory device along the YZ plane.

Figure 6:
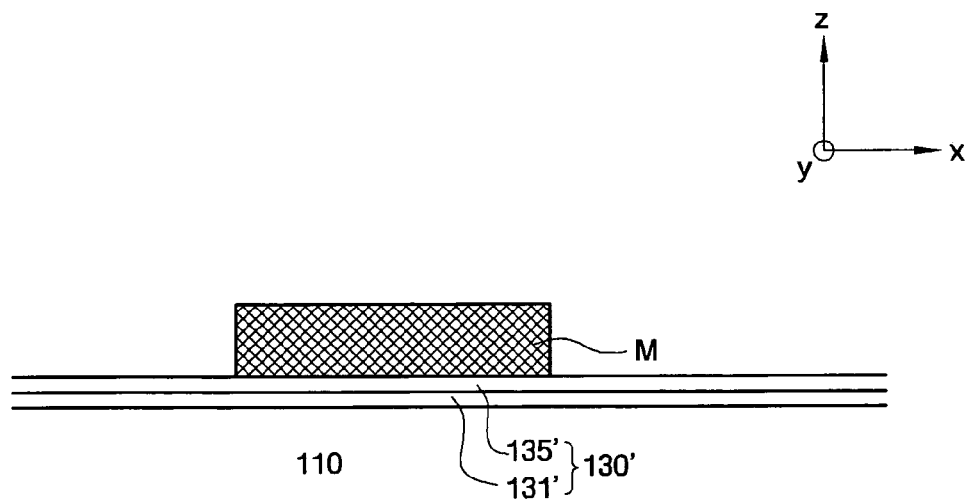
FIGS. 6, 7A, 7B, 8A, 8B, 9A, 9B, 10A and 10B illustrate cross-sectional views of stages of an exemplary method of fabricating a flash memory device employing the exemplary multilayer tunnel structure illustrated in FIGS. 1A and 1B.

Referring to FIG. 6, a first insulation layer 131' for forming the lower tunnel insulation layer 131, a second insulation layer 135' for forming the upper tunnel insulation layer 135, and a mask layer M may be formed on the substrate 110. The first insulation layer 131' and the second insulation layer 135' may form an insulation layer 130' for forming the tunnel insulator 130.

More particularly, e.g., the first insulation layer 131' for forming the lower tunnel insulation layer 131 may be formed on the substrate 110. Because a surface of the substrate 110 may, e.g., in some embodiments, be formed of monocrystalline silicon, the first insulation layer 131' may be a silicon oxide layer, which may be formed by, e.g., oxidizing the monocrystalline silicon of the substrate 110. The first insulation layer 131' may be formed on the surface, e.g., entire surface, of the substrate 110. In some embodiments of the present invention, the first insulation layer 131' may be formed by, e.g., injecting $H_2O$ or $O_2$ gas and heating the substrate 110 to a temperature of about 900° C. so that H+ and O− radicals may be generated and the surface of the substrate 110 may be oxidized. In some embodiments, the first insulation layer 131' may have a thickness of about 30 Å to about 50 Å. In some embodiments of the present invention, the thermal oxidation method may be one of radical oxidation methods.

In some embodiments of the present invention, a surface of the first insulation layer 131' may be treated with ozone ($O_3$) water. By treating the surface of the first insulation layer 131' with ozone water, it is possible to reduce incubation time for facilitating the formation of the second insulation layer 135' and to maximize the effect of incubation. That is, a thicker second insulation layer 135' may be formed within a shorter period of time when the surface of the first insulation layer 131' is treated with ozone water than when the surface of the first insulation layer 131' is not treated with ozone water. Thus, a surface roughness of the second insulation layer 135' may be reduced.

Treating the first insulation layer 131' using ozone water may provide a good condition for forming silicon seeds on the surface of the first insulation layer 131' in a relatively short period of time. It is possible to uniformly and/or substantially uniformly form a large number of silicon seeds on the surface of the first insulation layer 131'. Growing and depositing a film from the seeds may be relatively faster, more uniform, and have less surface roughness. In some embodiments of the invention, by treating the surface of the first insulation layer 131' using ozone water, characteristics, such as boundary, a crystalline (bond) of atoms and surface roughness, of the insulation layers, e.g., tunnel insulator, may be improved.

Ozone treatment of the surface of the first insulation layer 131' may be performed, e.g., by dipping a wafer into ozone water with an ozone concentration of about 50 ppm at clean room temperature for about 300 seconds. Embodiments of the invention are not limited thereto. For example, the ozone concentration of ozone water into which a wafer may be dipped and/or the amount of time for which the wafer is dipped into the ozone water may be varied.

In some embodiments of the present invention, the second insulation layer 135' may be a silicon oxide layer that may be formed by, e.g., oxidizing amorphous silicon. More particularly, e.g., in some embodiments, the second insulation layer 135' may be formed by providing an amorphous silicon layer on the first insulation layer 131', and thermally oxidizing the amorphous silicon layer. In some other embodiments, e.g., the second insulation layer 135' may be an incompletely oxidized silicon-rich-oxide layer. The silicon-rich-oxide layer may be formed by forming a silicon layer on the first insulation layer 131' and appropriately, but not completely, oxidizing the silicon layer.

In order to form the second insulation layer 135', the amorphous silicon layer may be formed on the first insulation layer 131' using, e.g., SiH4, Si2H6, Si3H8, SiH2Cl2, SiCl4, or Si2Cl6 gas or a combination of at least two of SiH4, Si2H6, Si3H8, SiH2Cl2, SiCl4, and Si2Cl6 gases as a source gas and using an atomic layer deposition (ALD)-like method. An ALD-like method may not exactly be an ALD method, but may be a deposition method by which a material layer is gradually deposited in stages. In some embodiments of the present invention, the amorphous silicon layer may be formed using, e.g., a low pressure-chemical vapor deposition (LP-CVD) method. The amorphous silicon layer may be formed to be thicker than the illustrated shapes in the drawings.

In embodiments of the present invention including, e.g., the amorphous silicon layer or the silicon-rich oxide layer, various deposition methods other than set forth herein may be used to form the amorphous silicon layer. For example, the amorphous silicon layer may be formed using a physical vapor deposition (PVD) method. The formation of the amorphous silicon layer may not necessarily be performed using an ALD-like method. That is, the amorphous silicon layer may be formed using, e.g., a typical CVD method.

The amorphous silicon layer may be oxidized using the same method used to form the first insulation layer 131', i.e., using a thermal oxidation method or a radical oxidation method. Oxidization of the amorphous silicon layer may be the same as the oxidization of the first insulation layer 131', and thus, a detailed description thereof will be omitted.

In some embodiments of the invention, one or both of the first insulation layer 131' and the second insulation layer 135' may be formed to a desired thickness in a single step. In other embodiments of the invention, one or both of the first insulation layer 131' and the second insulation layer 135' may be formed to a desired thickness in a multiple-step process, e.g., by forming the second insulation layer 135' or an amorphous silicon layer to be thicker than the desired thickness, and then, removing, e.g., an upper portion of the second insulation layer 135' or the amorphous silicon layer so that the thickness of the second insulation layer 135' or the amorphous silicon layer may be reduced to the desired thickness. For example, the second insulation layer 135' may be initially formed to be thicker than a desired thickness, and then, the upper portion of the second insulation layer 135' may be removed using, e.g., an HF solution so that the thickness of the second insulation layer 135' may be reduced to the desired thickness. The HF solution may be a diluted HF solution that is widely used in typical semiconductor processes. More specifically, e.g., the HF solution may be an HF solution diluted or mixed with water to a volume ratio of about 0.1% to about 10%. The second insulation layer 135' may be removed at a rate of about 0.3 Å/sec.

In some embodiments of the present invention, the upper portion of the second insulation layer 135' may be partially removed using, e.g., SC-1, instead of using a diluted HF solution. SC-1 contains liquid hydrogen peroxide, ammonia, and water, and is a well-known rinse solution used in typical semiconductor processes. It is obvious to one of ordinary skill in the art to which one or more aspects of the present invention pertain that the mixing ratio of liquid hydrogen peroxide, ammonia, and water in SC-1 may be altered in various manners according to the purpose of use.

Embodiments of the present invention may enable the second insulation layer 135' to be formed to have a sufficient thickness, and thus, properties of the upper tunnel insulation layer 135 may be improved. Therefore, embodiments of the invention may provide devices including an upper tunnel insulation layer having improved properties by forming the second insulation layer 135' to have at least a desired thickness.

Referring still to FIG. 6, the mask layer M may be formed. The mask layer M may be used to form the lower tunnel insulation layer 131 and the upper tunnel insulation layer 135 by patterning the first insulation layer 131' and the second insulation layer 135', respectively. In embodiments of the present invention, the mask layer M may be, e.g., a photoresist layer or a hard mask layer. If the mask layer M is a hard mask layer, the mask layer M may include, e.g., a silicon nitride layer or a silicon oxynitride layer.

Figure 7A:
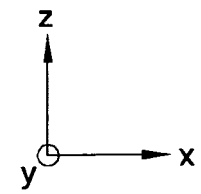
Figure 7A:
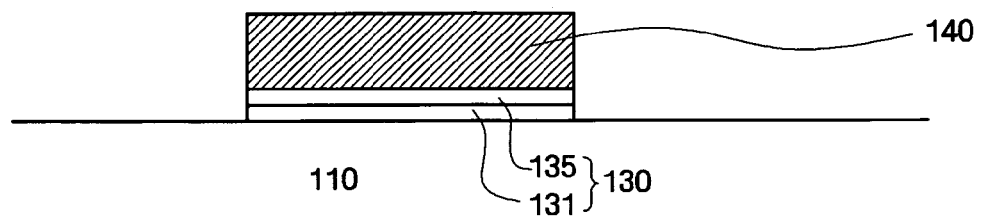

Referring to FIG. 7A, the lower tunnel insulation layer 131, the upper tunnel insulation layer 135, and the floating gate 140 may be formed by performing a photolithography operation, and then, the mask layer M may be removed. Photolithography is well known to one of ordinary skill in the art to which one or more aspects of the present invention pertain, and thus, a detailed description of photolithography will not be provided.

Figure 7B:
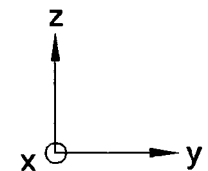
Figure 7B:
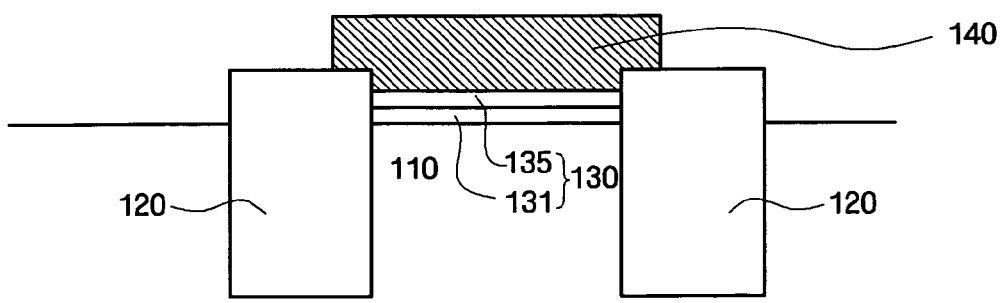

Referring to FIG. 7B, after forming the tunnel insulator 130, the isolations 120 may be formed.

For example, the isolations 120 may be formed by, e.g., forming a silicon nitride layer (not shown) on the tunnel insulator 130, performing a photolithography operation so that trenches may be formed, filling the trenches with a dielectric material, and performing a chemical mechanical polishing (CMP) operation so that the tunnel insulation layer 130 may be separated by the isolations 120. As a result of the CMP operation, a thickness of the tunnel insulator 130 along the Z direction may be less than the distance, along the Z direction, that the isolations 120 protrude beyond the upper surface 110*a* of the substrate 110, as illustrated in FIG. 7B. However, in embodiments of the present invention, the tunnel insulator 130 may be formed to have a height, e.g., thickness of the tunnel insulator 130 relative to the upper surface 110*a* (see FIG. 1B) of substrate 110, that is the same and/or substantially the same as a distance that isolations 120 protrude beyond the upper surface 110*a* of the substrate 110. For example, in the isolations 120 may be formed by forming a buffer layer (not shown), e.g., a silicon layer, on the tunnel insulator 130 and forming a silicon nitride layer on the buffer layer, and in such cases, e.g., the tunnel insulator 130 may be as tall as, e.g., have a same or substantially same height as, the isolations 120.

If the mask layer M used to pattern the first and second insulation layers 131' and 135' is a hard mask layer, removal of the mask layer M may be optional. That is, e.g., the mask layer M may be used to form the tunnel insulator 130 and a trench sequentially or simultaneously.

Thereafter, a conductive layer may be formed, and a photolithography operation may be performed, thereby forming the floating gate 140, so that separate floating gates 140 may be provided for each unit cell. The floating gate 140 may be formed, e.g., of conductive polycrystalline silicon. The conductive floating gate 140 may be formed by forming a polycrystalline silicon layer, forming a buffer layer (not shown), e.g., a silicon oxide layer, on the polycrystalline silicon layer, and implanting, e.g., B, P or As ions.

To form an N-type gate, P, As or other ions including P or As may be implanted into the floating gate 140. To form a P-type gate, B or other ions including B may be implanted into the floating gate 140.

The buffer layer may be removed before or after formation of the floating gate 140. For example, the conductive layer employed for forming the floating gate 140 may be formed by providing a monocrystalline silicon layer and annealing the monocrystalline silicon layer at a temperature of about 800° C. so that the monocrystalline silicon layer may be transformed into a polycrystalline silicon layer.

Figure 8A:
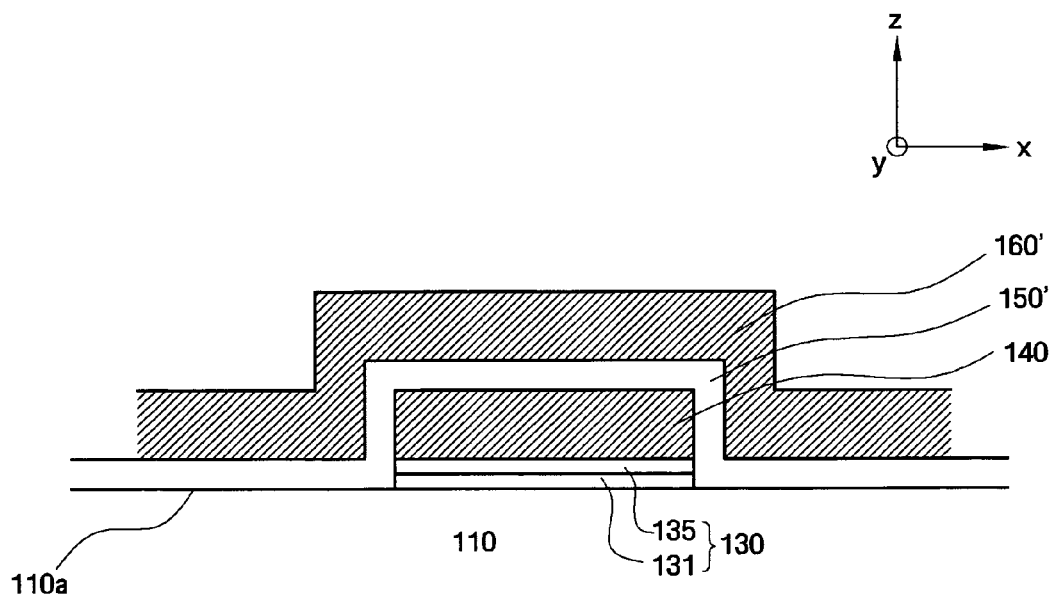
Figure 8B:
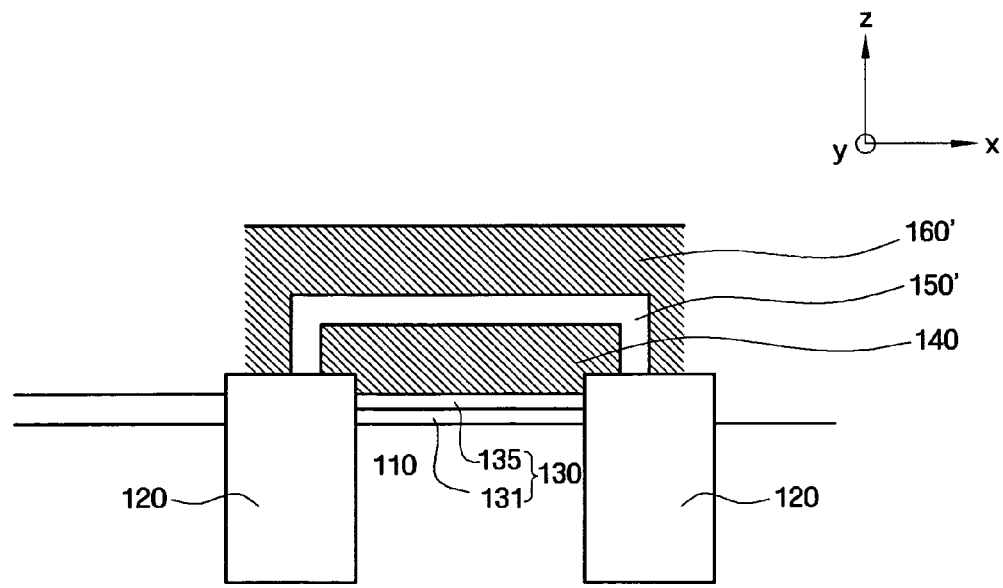

Referring to FIGS. 8A and 8B, an insulation layer 150' for forming the intergate insulation layer 150 may be formed on the upper surface 110a, e.g., the entire upper surface 110a, of the substrate 110, and a conductive layer 160' for forming the control gate 160 may be formed on the insulation layer 150'.

In embodiments of the present invention, the insulation layer 150' may be formed, e.g., as a triple layer including a silicon oxide layer, a silicon nitride layer, and a silicon oxide layer. In such cases, a silicon oxide layer may be formed on the upper surface 110a of the substrate 110, e.g., on the substrate 110, the isolation 120 and/or the upper tunnel insulation layer 135, a silicon nitride layer may be formed on the silicon oxide layer, and a silicon oxide layer may be formed on the silicon nitride layer, thereby forming the insulation layer 150'. An intergate insulation layer 150 formed in such a manner may effectively trap electrons, and thus, may be employed by a CTF memory device. The insulation layer 150' may be formed using a deposition method, e.g., a CVD method.

In embodiments of the present invention, to form the control gate 150, the conductive layer 160' may then be formed on the upper surface 110a of the substrate 110, e.g., on insulation layer 150' formed on the substrate 110. The conductive layer 160' may be formed of, e.g., conductive polycrystalline silicon, as a metal silicide layer or a metallic layer.

Figure 9A:
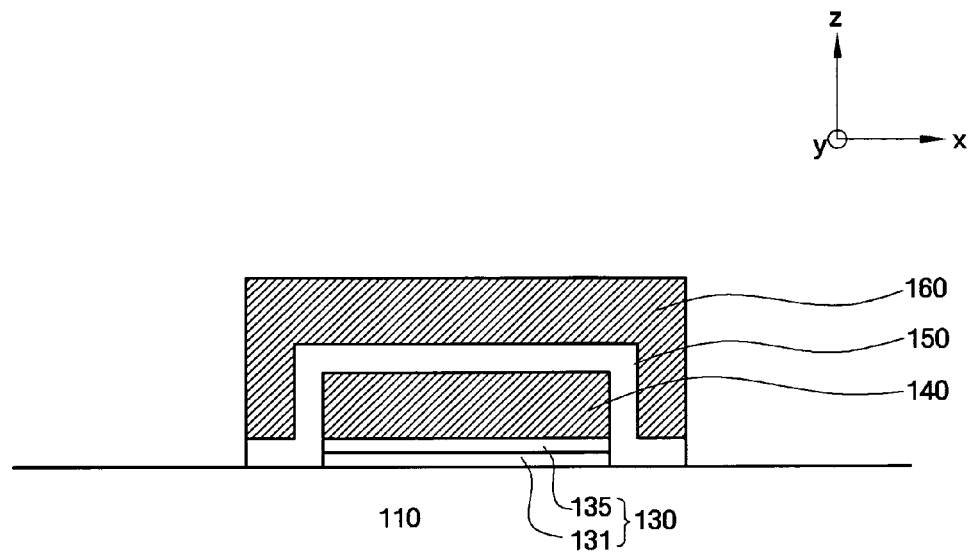
Figure 9B:
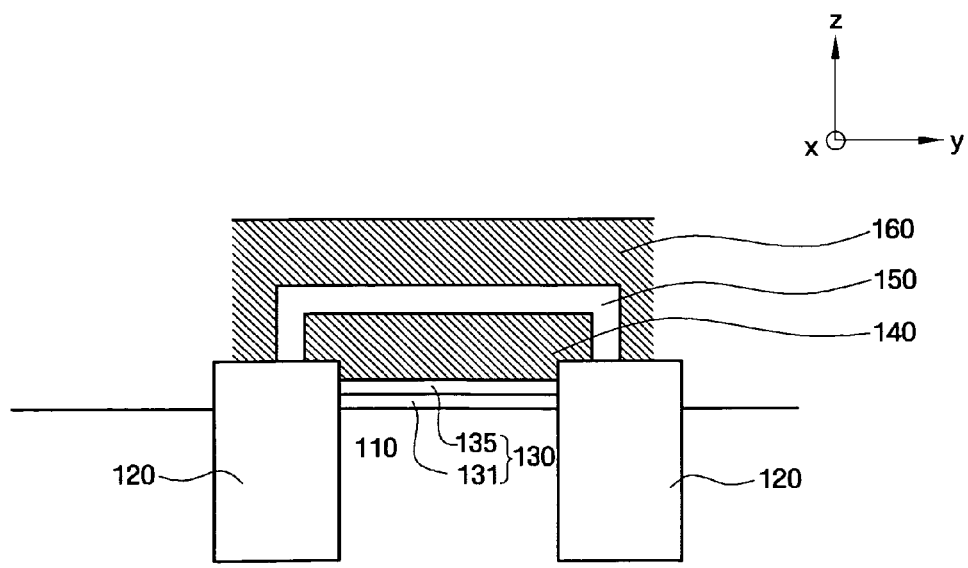

Referring to FIGS. 9A and 9B, the intergate insulation layer 150 and the control gate 160 may be formed, e.g., by performing a photolithography operation. The intergate insulation layer 150 may separated along the X and Y directions, such that a separate intergate insulation layer 150 may be provided for each of the unit cells. However, in embodiments of the present invention, the intergate insulation layer 150 may not be separated for each of the unit cells along the Y direction. The formation of the intergate insulation layer 150 and the control gate 160 through photolithography is well known to one of ordinary skill in the art to which one or more aspects of the present invention pertain, and a detailed description thereof will not be provided.

Figure 10A:
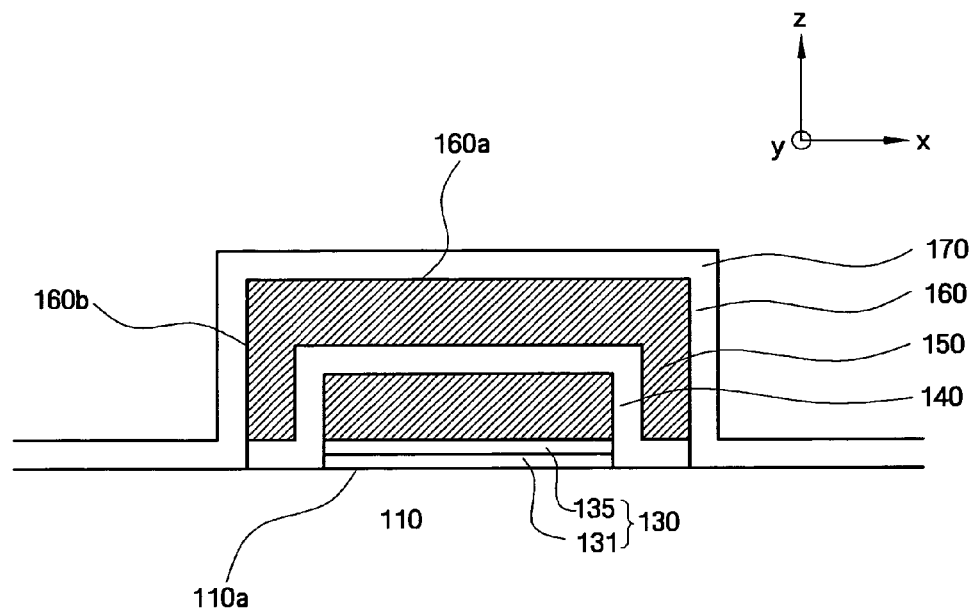
Figure 10B:
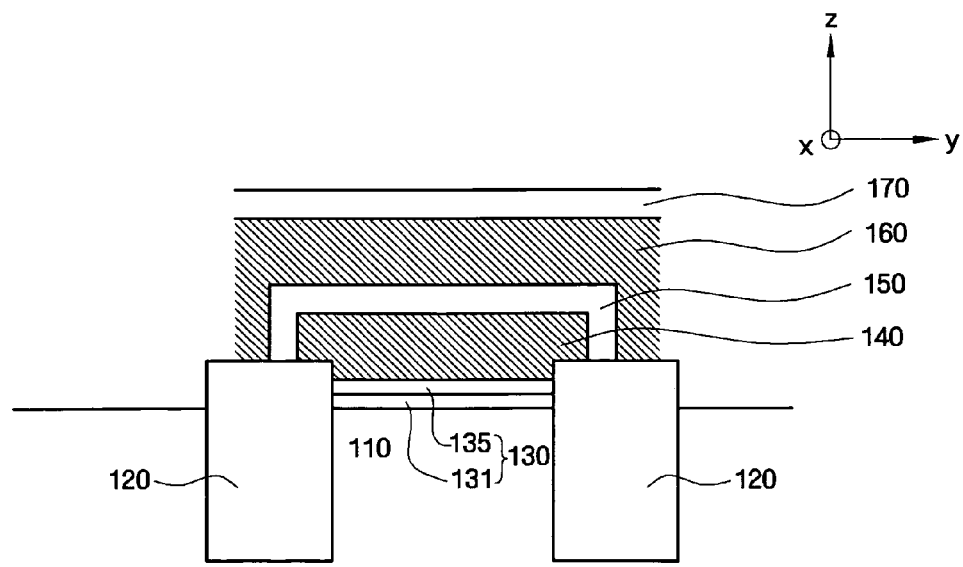

Referring to FIGS. 10A and 10B, the capping layer 170 may be formed on the control gate 160. In embodiments of the present invention, the capping layer 170 may include a silicon oxide layer. As shown in FIG. 10A, the capping layer 170 may be formed to contact the upper surface 160a and the sides 160b of the control gate 160 and portions of the upper surface 110a of the substrate 110 along the X direction, and, as shown in FIG. 8B, may cover the upper surface 160a of the control gate 160 along the Y direction. The capping layer 170 may be formed using a deposition method.

Thereafter, a silicon nitride layer (not shown) may be formed on the capping layer 170. Then, contacts, signal lines, and/or vias for signal transmission may be formed, thereby completing the exemplary formation of a flash memory device.

Figure 11:
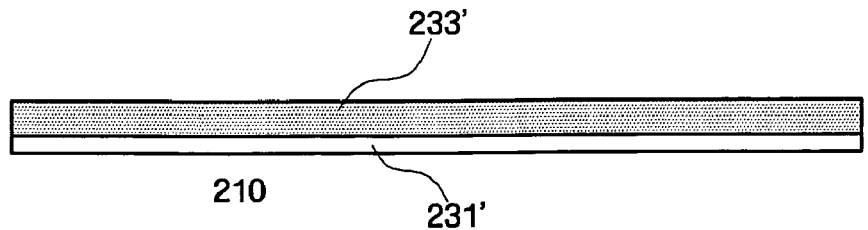
FIGS. 11 and 12 illustrate cross-sectional views of stages of a method of fabricating a tunnel insulator of a flash memory device according to another exemplary embodiment of the present invention.
Figure 12:
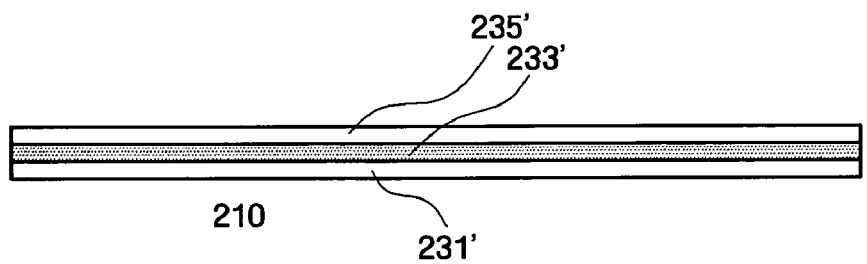

A method of fabricating an exemplary flash memory device according to a second exemplary embodiment of the present invention will hereinafter be described. FIGS. 11 and 12 illustrate cross-sectional views of resulting structures obtained during an exemplary method of fabricating a flash memory device employing the exemplary multilayer tunnel structure illustrated in FIGS. 2A and 2B.

Referring to FIG. 11, a lower insulation layer 231' for forming the lower tunnel insulation layer 231 may be formed on the substrate 210, and an amorphous silicon layer 233' for forming the intermediate tunnel insulation layer 233 may be formed on the lower insulation layer 231'. In embodiments of the present invention, the intermediate tunnel insulation layer 233 may be, e.g., a silicon-rich-oxide layer.

In embodiments of the present invention, after the formation of the lower insulation layer 231', the surface of the lower insulation layer 231' may be treated with ozone water.

In embodiments of the present invention, the amorphous silicon layer 233' may be thicker than the lower insulation layer 231'. The lower insulation layer 231' may be formed by thermal oxidation or radical oxidation of the substrate 210. The amorphous silicon layer 233' may be formed using, e.g., $SiH_4$, $Si_2H_6$, $Si_3H_8$, $SiH_2Cl_2$, $SiCl_4$, or $Si_2Cl_6$ gas or a combination of at least two of $SiH_4$, $Si_2H_6$, $Si_3H_8$, $SiH_2Cl_2$, $SiCl_4$, and $Si_2Cl_6$ gases as a source gas and using an ALD-like method.

Alternatively, the amorphous silicon layer 233' may be formed using, e.g., a typical CVD method, an ALD method, or a physical vapor deposition (PVD) method.

Referring to FIG. 12, an upper insulation layer 235' for forming the upper tunnel insulation layer 235 may be formed by thermally oxidizing a surface of the amorphous silicon layer 233'. More particularly, e.g., the amorphous silicon layer 233' may be thermally oxidized for a predetermined amount of time, to complete formation of the exemplary tunnel insulator 230, as a triple layer structure. Oxidizing an amorphous silicon layer is well known to one of ordinary skill in the art to which one or more aspects of the present invention pertains, and may involve a variety of processing conditions (e.g., temperature). Thus, a detailed description of the oxidization of the amorphous silicon layer 233' will be omitted.

In embodiments of the present invention, after the formation of the upper insulation layer 235', the surface of the upper insulation layer 235' may be partially removed using an HF solution or SC-1 so that the thickness of the tunnel insulator 230 can be appropriately adjusted.

Embodiments of the present invention provide memory devices having improved properties relative to conventional memory devices. FIGS. 13 through 18 illustrate some of the advantageous effects that may be obtained by employing one or more aspects of the present invention.

Figure 13:
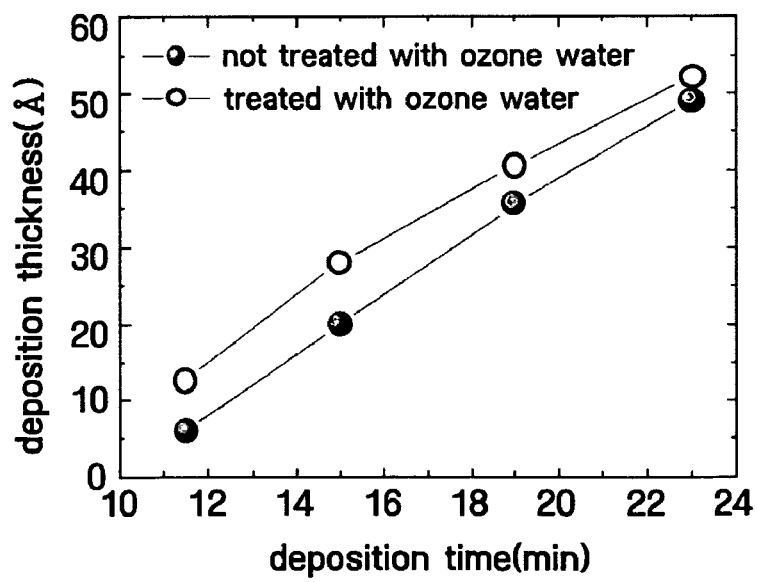
FIG. 13 illustrates a graph of a relationship between thickness measurement results of amorphous silicon layers obtained using lower tunnel oxide layers that are treated with ozone water and thickness measurement results of amorphous silicon layers obtained using lower tunnel oxide layers that are not treated with ozone water.

FIG. 13 illustrates a graph of a relationship between thickness measurement results obtained from multilayer tunnel insulators including a lower tunnel insulation layer whose surface is treated with ozone water and thickness measurement results obtained from multilayer tunnel insulators including a lower tunnel insulation layer whose surface is not treated with ozone water. Referring to FIG. 13, the X axis represents deposition time, and the Y axis represents deposited thickness.

Referring to FIG. 13, amorphous silicon is deposited more quickly when the surface of a lower tunnel insulation layer is treated with ozone water than when the surface of a lower tunnel insulation layer is not treated with ozone water. That is, it is possible to form a thicker amorphous silicon layer within a given amount of time by treating the surface of a lower tunnel insulation layer with ozone water. Referring to FIG. 13, an amorphous silicon layer obtained by treating the surface of a lower tunnel insulation layer with ozone water may be about 3.2 Å to about 8.3 Å thicker than an amorphous silicon layer obtained when a surface of the lower tunnel insulation layer has not been treated with ozone water. Such a difference in thickness, however inconsiderable it may appear, is likely to result in significant performance differences, especially when the above-mentioned deposition operation is performed in a batch type apparatus where dozens or hundreds of wafers are processed together at the same time.

Figure 14:
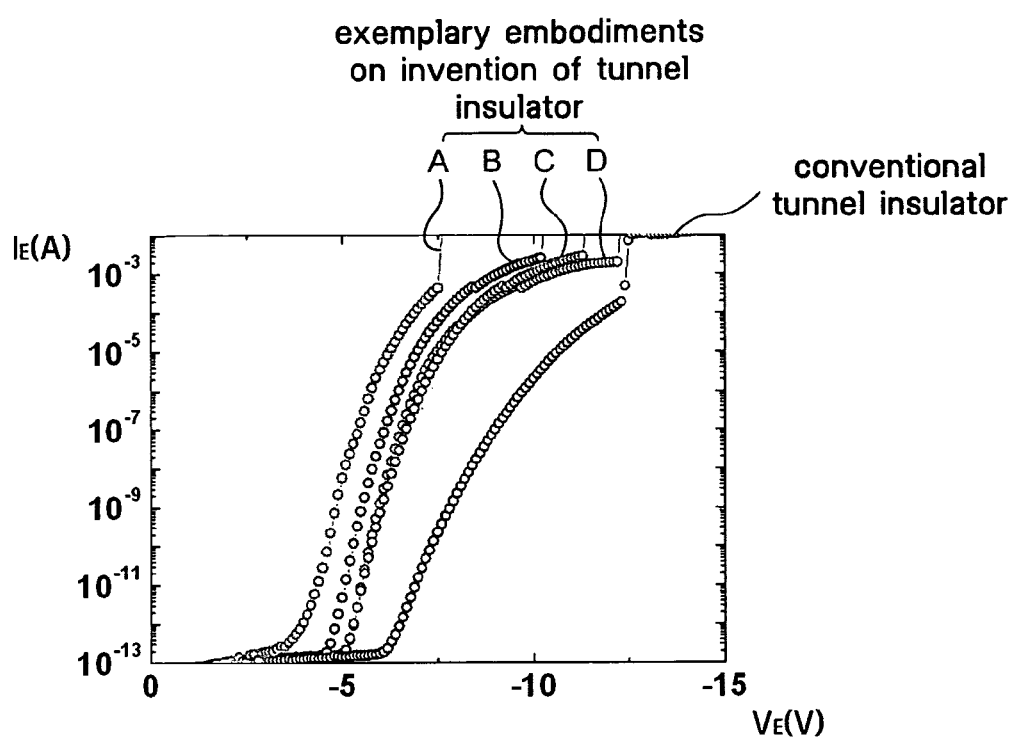
FIG. 14 illustrates a graph of a relationship between erasing tunneling effect measurement results obtained from a memory device employing one or more aspects of the present invention and erasing tunneling effect measurement results of a memory device employing a conventional tunnel insulator.

FIG. 14 illustrates a graph of a relationship between erasing tunneling effect measurement results obtained from a memory device employing one or more aspects of the present invention and erasing tunneling effect measurement results of a memory device employing a conventional tunnel insulator. Referring to FIG. 14, the X axis represents a tunneling voltage VE, the Y axis represents a tunneling current IE, and reference characters A, B, C, and D correspond to the memory device employing one or more aspects of the present invention.

More particularly, reference character A corresponds to a multilayer tunnel insulator having a total thickness of 72 Å, which includes lower, intermediate, and upper tunnel insulation layers respectively having thicknesses of 32 Å, 10 Å, and 30 Å. Reference character B corresponds to a multilayer tunnel insulator having a total thickness of 90 Å, which includes lower, intermediate, and upper tunnel insulation layers respectively having thicknesses of 40 Å, 10 Å, and 40 Å. Reference character C corresponds to a multilayer tunnel insulator having a total thickness of 100 Å, which includes lower, intermediate, and upper tunnel insulation layers respectively having thicknesses of 45 Å, 10 Å, and 45 Å. Reference character D corresponds to a multilayer tunnel insulator having a complete thickness of 110 Å, which includes intermediate, and upper tunnel insulation layers respectively having thicknesses of 40 Å, 10 Å, and 60 Å.

The thickness of the conventional single-layer tunnel insulator was set to about 83 Å.

Referring to FIG. 14, for the same tunneling voltage, the multilayer tunnel insulators A, B, C, and D may provide higher tunneling currents than the conventional single-layer tunnel insulator. The multilayer tunnel insulators A, B, C, and D may be thicker than the conventional single-layer tunnel insulator, and also provide better properties than the conventional single-layer tunnel insulator. That is, the multilayer tunnel insulators A, B, C, and D may achieve as high a tunneling current as the conventional single-layer tunnel insulator while being driven at a lower voltage than the conventional single-layer tunnel insulator, and thus, may reduce power consumption.

Figure 15:
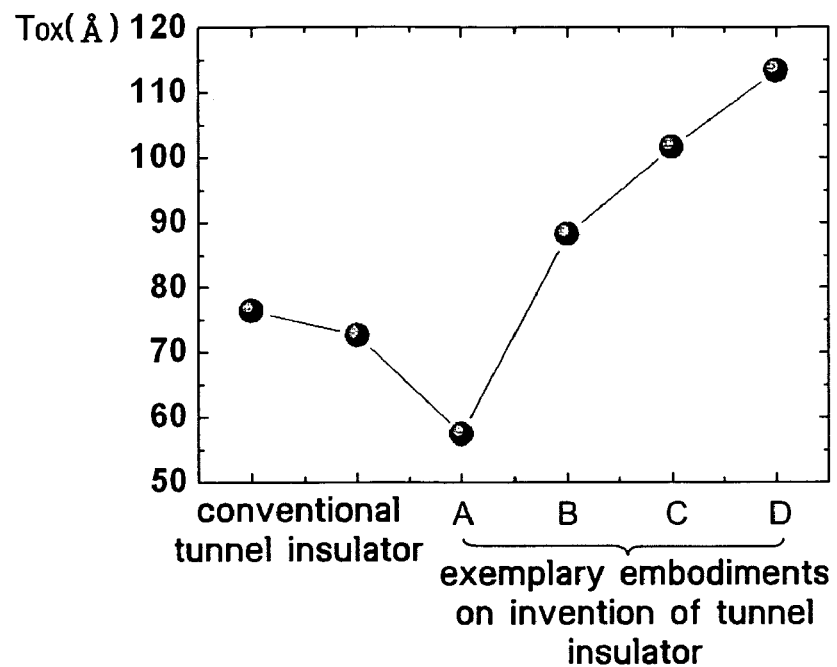
FIG. 15 illustrates a graph of a relationship between electrical thickness measurement results of multilayer tunnel insulators according to exemplary embodiments of the present invention and electrical thickness measurement results of a conventional single-layer tunnel insulator.

FIG. 15 illustrates a graph of a relationship between electrical thickness measurement results of the multilayer tunnel insulators A, B, C, and D according to exemplary embodiments of the present invention and electrical thickness measurement results of conventional single-layer tunnel insulators. Referring to FIG. 15, the X axis displays conventional single-layer tunnel insulators and the multilayer tunnel insulators A, B, C, and D according to exemplary embodiments of the present invention, and the Y axis represents physical thickness, i.e., thickness-of-oxide TOX (Å).

Referring to FIG. 15, the multilayer tunnel insulators A, B, C, and D may be physically thicker than conventional single-layer tunnel insulators. Specifically, the physical thickness of a tunnel insulator may be determined by measuring the capacitance of the tunnel insulator. The lower the capacitance of a tunnel insulator is, generally, the greater the electrical thickness of the tunnel insulator becomes. On the contrary, generally, the higher the capacitance of a tunnel insulator is, the lower the electrical thickness of the tunnel insulator becomes. In general, the lower the electrical thickness of a tunnel insulator becomes, the better the tunneling properties of the tunnel insulator become.

Figure 16:
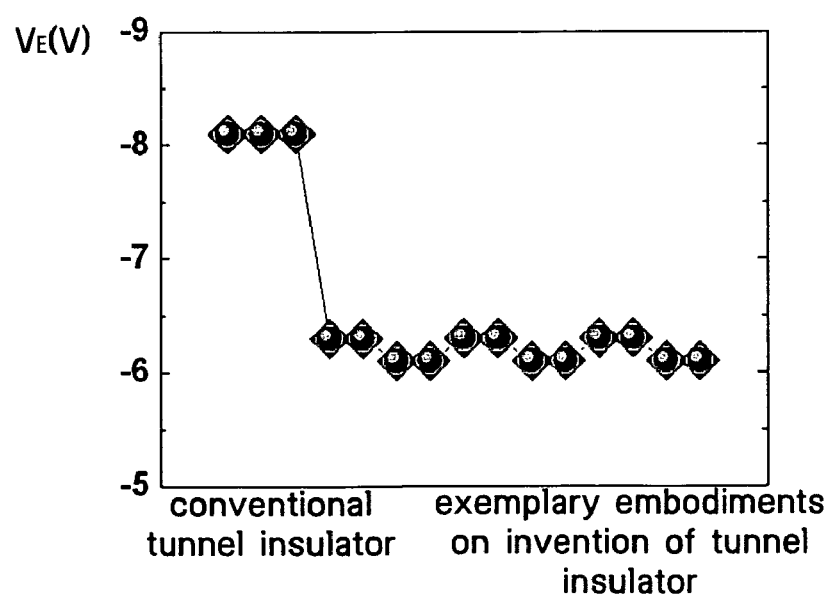
FIG. 16 illustrates a graph of a relationship between erase voltage property measurement results of multilayer tunnel insulators according to exemplary embodiments of the present invention and erase voltage property measurement results of a conventional single-layer tunnel insulator.

FIG. 16 illustrates a graph of a relationship between erase voltage property measurement results of multilayer tunnel insulators according to exemplary embodiments of the present invention and erase voltage property measurement results of conventional single-layer tunnel insulators. Referring to FIG. 16, the X axis displays tunnel insulators according to embodiments of the present invention and conventional single-layer tunnel insulators, and the Y axis represents a tunneling voltage VE, which is a voltage at which tunneling occurs i.e., an erase voltage.

In FIG. 16, the three dots from the far left indicate the erase voltage properties of conventional single-layer tunnel insulators, and the other dots indicate the erase voltage properties of multilayer tunnel insulators according to embodiments of the present invention. Referring to FIG. 16, erase voltages provided by multilayer tunnel insulators according to embodiments of the present invention are about 2V lower than erase voltages provided by conventional single-layer tunnel insulators. That is, multilayer tunnel insulators according to embodiments of the present invention may operate at lower erase voltages than conventional single-layer tunnel insulators. Accordingly, multilayer tunnel insulators employing one or more aspects of the present invention may provide better coupling properties and higher reliability and endurance than conventional single-layer tunnel insulators, while consuming less power than conventional single-layer tunnel insulators.

Experimental results show that multilayer tunnel insulators according to embodiments of the present invention may separately provide higher endurance than conventional tunnel insulators because information-program/erase-operation states may be performed at lower voltages in embodiments of the present invention than in conventional single-layer tunnel insulators. Thus, multilayer tunnel insulators according to embodiments of the present invention may be less affected than conventional single-layer tunnel insulators by physical stress.

Experimental results separately show that, even under hard conditions, multilayer tunnel insulators according to embodiments of the present invention provide better properties, including information retention properties, and maintain the improved properties for a longer period of time than conventional single-layer tunnel insulators.

Figure 17:
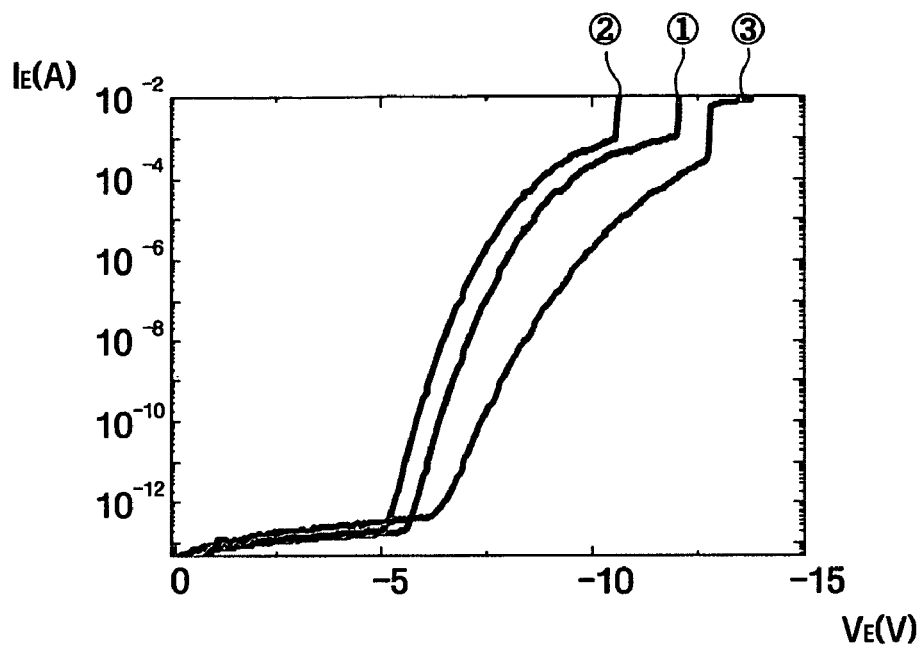
FIG. 17 illustrates a graph of a relationship between current-voltage property measurement results of multilayer tunnel insulators according to exemplary embodiments of the present invention and current-voltage property measurement results of a conventional single-layer tunnel insulator.

FIG. 17 illustrates a graph of a relationship between current-voltage properties of an ozone-treated multilayer tunnel insulator according to an embodiment of the present invention, current-voltage properties of a non-ozone-treated multilayer tunnel insulator according to an embodiment of the present invention, and current-voltage properties of a conventional single-layer tunnel insulator. Referring to FIG. 17, the X axis represents a voltage applied, and the Y axis represents a current corresponding to the applied voltage.

Referring to FIG. 17, the multilayer tunnel insulators according to embodiments of the present invention provide better current-voltage properties than the conventional single-layer tunnel insulator. More particularly, before tunneling occurs, the multilayer tunnel insulators according to exemplary embodiments of the present invention may provide lower currents than the conventional single-layer tunnel insulator at any given voltage before tunneling occurs, thereby achieving improvements in information retention capabilities. After tunneling occurs, the multilayer tunnel insulators according to embodiments of the present invention may provide higher currents than the conventional single-layer at any given voltage after tunneling occurs. Given that it may be desired for a tunnel insulator to provide as low a tunneling voltage as possible and as high a current as possible at any given voltage after tunneling occurs, the steeper a slope of a curve representing the current-voltage properties of a tunnel insulator is, the better the current-voltage properties of the tunnel insulator may become. In this regard, the multilayer tunnel insulators according to embodiments of the present invention may provide better properties than the conventional single-layer tunnel insulator in all aspects. The thickness of the conventional single-layer tunnel insulator was set to about 83 Å, the thickness of the non-ozone-treated multilayer tunnel insulator according to an embodiment of the present invention was set to about 102 Å, and the thickness of the ozone-treated multilayer tunnel insulator according to an embodiment of the present invention was set to about 112 Å.

Figure 18:
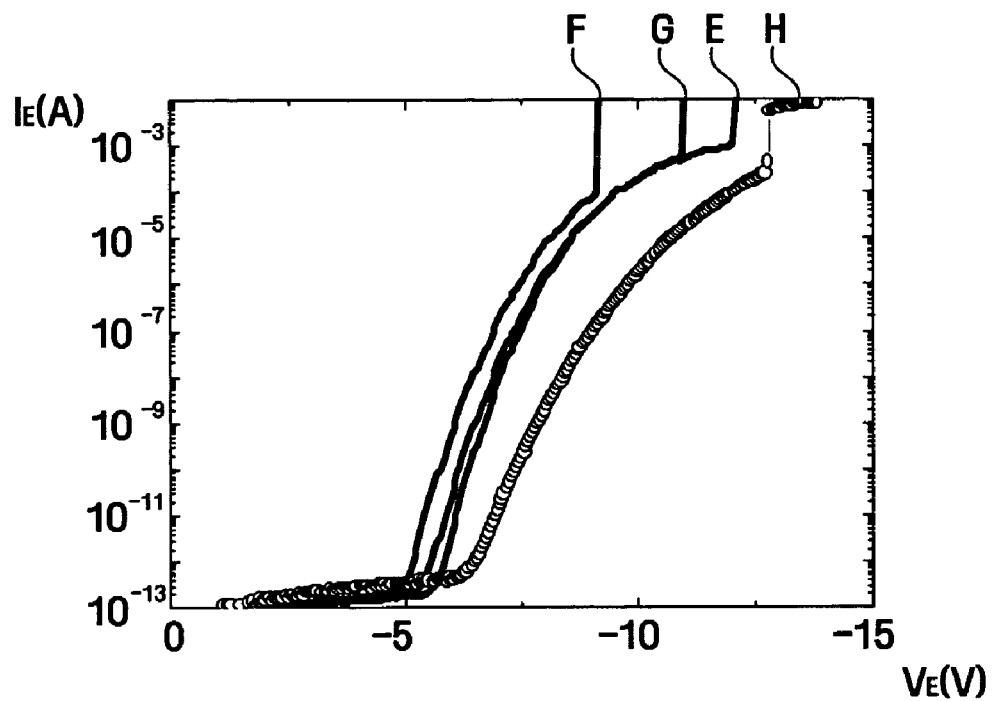
FIG. 18 illustrates a graph of a relationship between current-voltage properties of a multilayer tunnel insulator obtained using an upper tunnel insulation layer whose surface has not been treated with an HF solution, current-voltage properties of a multilayer tunnel insulator obtained using an upper tunnel insulation layer whose surface has been treated with an HF solution so that about 30 Å of an upper portion of the upper tunnel insulation layer is removed, current-voltage properties of a multilayer tunnel insulator obtained by treating the surface of an upper tunnel insulation layer with an HF solution so that about 15 Å of an upper portion of the upper tunnel insulation layer can be removed, and current-voltage properties of a conventional single-layer tunnel insulator.

FIG. 18 illustrates a graph of a relationship between current-voltage properties of a multilayer tunnel insulator E obtained when the surface of an upper tunnel insulation layer was not treated with an HF solution, current-voltage properties of a multilayer tunnel insulator F obtained by treating the surface of an upper tunnel insulation layer with an HF solution so that about 30 Å of an upper portion of the upper tunnel insulation layer may be removed, current-voltage properties of a multilayer tunnel insulator G obtained by treating the surface of an upper tunnel insulation layer with an HF solution so that about 15 Å of an upper portion of the upper tunnel insulation layer may be removed, and current-voltage properties of a conventional single-layer tunnel insulator H. Referring to FIG. 18, the X axis represents a voltage applied, and the Y axis represents a current corresponding to the voltage.

Referring to FIG. 18, the multilayer tunnel insulators E, F and G according to embodiments of the present invention all provide better current-voltage properties than the conventional single-layer tunnel insulator H. Also, the multilayer tunnel insulators E, F and G according to embodiments of the present invention may maintain the experimental results illustrated in FIG. 17. Therefore, it is possible to freely adjust the thickness of a multilayer tunnel insulator.

As described above, the flash memory device including a multilayer tunnel insulator employing one or more aspects of the present invention may provide stable programming and erasing properties at program and erase voltages, respectively, and may provide stable information retention properties at an information retention voltage.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
a lower tunnel insulation layer on a substrate;
an upper tunnel insulation layer on the lower tunnel insulation layer;
a P-type floating gate on the upper tunnel insulation layer;
an intergate insulation layer on the floating gate; and
a control gate on the intergate insulation layer,
wherein:
the upper tunnel insulation layer includes an amorphous oxide layer,
the lower tunnel insulation layer and the upper tunnel insulation layer extend between isolations protruding from an upper surface of the substrate,
the P-type floating gate and the intergate insulation layer both contact an upper surface of the isolations,
a distance that the isolations protrude from the upper surface of the substrate is larger than a distance between an upper surface of the upper tunnel insulation layer and the upper surface of the substrate,
the P-type floating gate contacts the upper tunnel insulation layer, the upper tunnel insulation layer contacts the lower tunnel insulation layer, and
the lower tunnel insulation layer includes an oxide.

2. The flash memory device as claimed in claim 1, wherein the upper tunnel insulation layer comprises a silicon-rich oxide layer.

3. The flash memory device as claimed in claim 1, wherein the upper tunnel insulation layer has a larger energy band gap than the lower tunnel insulation layer.

4. A flash memory device, comprising:
a multi-layer tunnel insulator on a substrate;
a P-type floating gate on the multi-layer tunnel insulator;
an intergate insulation layer on the floating gate, and
a control gate on the intergate insulation layer,
wherein the multi-layer tunnel insulator comprises:
a first tunnel insulation layer having a first energy gap, and
a second tunnel insulation layer having a second energy gap greater than the first energy gap,
wherein:
the first tunnel insulation layer and the second tunnel insulation layer extend between isolations protruding from an upper surface of the substrate,
the P-type floating gate and the intergate insulation layer both contact an upper surface of the isolations,
a distance that the isolations protrude from the upper surface of the substrate is larger than a distance between an upper surface of the second tunnel insulation layer and the upper surface of the substrate,
the P-type floating gate contacts the second tunnel insulation layer, the second tunnel insulation layer contacts the first tunnel insulation layer, and
the first tunnel insulation layer includes an oxide.

5. A method of fabricating a flash memory device, comprising:
forming a lower tunnel insulation layer on a substrate;
treating a surface of the lower tunnel insulation layer with ozone water;
forming an upper tunnel insulation layer on the lower tunnel insulation layer;
forming a P-type floating gate on the upper tunnel insulation layer;
forming an intergate insulation layer on the floating gate; and
forming a control gate on the intergate insulation layer,
wherein the upper tunnel insulation layer includes an amorphous oxide layer, the lower tunnel insulation layer and the upper tunnel insulation layer extend between isolations protruding from an upper surface of the substrate, a distance that the isolations protrude from the upper surface of the substrate is larger than a distance between an upper surface of the upper tunnel insulation layer and the upper surface of the substrate, the intergate insulation layer and the P-type floating gate both contact an upper surface of the isolations, the P-type floating gate contacts the upper tunnel insulation layer, the upper tunnel insulation layer contacts the lower tunnel insulation layer, and the lower tunnel insulation layer includes an oxide.

6. The method as claimed in claim 5, wherein forming the lower tunnel insulation layer comprises thermally oxidizing a surface of the substrate.

7. The method as claimed in claim 5, wherein forming the upper tunnel insulation layer comprises forming a silicon-rich oxide layer.

8. The method as claimed in claim 5, further comprising:
partially removing a surface of the upper tunnel insulation layer using a diluted HF solution or SC-1 after forming the upper tunnel insulation layer.

9. The method as claimed in claim 5, wherein the upper tunnel insulation layer has a larger energy gap than the lower tunnel insulation layer.

* * * * *